(12) United States Patent
Goergen et al.

(10) Patent No.: US 10,462,894 B2
(45) Date of Patent: *Oct. 29, 2019

(54) CIRCUIT BOARD

(71) Applicant: FORCE10 NETWORKS, INC., San Jose, CA (US)

(72) Inventors: Joel R. Goergen, Maple Grove, MN (US); Yi Zheng, Cold Spring, MN (US)

(73) Assignee: Force10 Networks, Inc., San Jose, CA (US)

( * ) Notice: Subject to any disclaimer, the term of this patent is extended or adjusted under 35 U.S.C. 154(b) by 851 days.

This patent is subject to a terminal disclaimer.

(21) Appl. No.: 14/555,227

(22) Filed: Nov. 26, 2014

(65) Prior Publication Data

US 2015/0156863 A1 Jun. 4, 2015

Related U.S. Application Data

(60) Continuation of application No. 12/961,610, filed on Dec. 7, 2010, now Pat. No. 8,898,891, which is a
(Continued)

(51) Int. Cl.
*H05K 1/00* (2006.01)
*H05K 1/02* (2006.01)
(Continued)

(52) U.S. Cl.
CPC .......... *H05K 1/0216* (2013.01); *H01P 3/081* (2013.01); *H05K 1/024* (2013.01); *H05K 1/0242* (2013.01); *H05K 1/0245* (2013.01); *H05K 1/0298* (2013.01); *H05K 3/0091* (2013.01); *H05K 3/46* (2013.01); *B32B 2305/076* (2013.01); *B32B 2309/08* (2013.01);

*B32B 2457/08* (2013.01); *H05K 1/0366* (2013.01); *H05K 3/4611* (2013.01); *H05K 2201/0187* (2013.01); *H05K 2201/029* (2013.01); *H05K 2201/098* (2013.01);
(Continued)

(58) Field of Classification Search
CPC .......... B32B 2305/076; B32B 2309/08; B32B 2457/08; H01P 3/081; H05K 1/0216; H05K 1/024; H05K 1/0242; H05K 1/0245; H05K 1/0298; H05K 1/0366; H05K 2201/0187; H05K 2201/029; H05K 2201/09236

See application file for complete search history.

(56) References Cited

U.S. PATENT DOCUMENTS 3,391,454 A 7/1968 Reimann et al.
4,639,693 A * 1/1987 Suzuki ............... H01B 7/0838
174/117 F
(Continued)

FOREIGN PATENT DOCUMENTS

TW 521551 2/2003
TW 592015 6/2004

*Primary Examiner* — Yuriy Semenenko
(74) *Attorney, Agent, or Firm* — Haynes and Boone, LLP

(57) ABSTRACT

Circuit boards and methods for their manufacture are disclosed. The circuit boards carry high-speed signals using conductors formed to include lengthwise channels. The channels increase the surface area of the conductors, and therefore enhance the ability of the conductors to carry high-speed signals. In at least some embodiments, a discontinuity also exists between the dielectric constant within the channels and just outside the channels, which is believed to reduce signal loss into the dielectric material.

22 Claims, 27 Drawing Sheets

Related U.S. Application Data division of application No. 12/151,088, filed on May 2, 2008, now Pat. No. 8,168,891, which is a continuation-in-part of application No. 11/977,783, filed on Oct. 26, 2007, now Pat. No. 8,304,659.

(51) Int. Cl.
| | | |
|---|---|---|
| *H01P 3/08* | (2006.01) | |
| *H05K 3/00* | (2006.01) | |
| *H05K 3/46* | (2006.01) | |
| *H05K 1/03* | (2006.01) | |

(52) U.S. Cl.
CPC .............. *H05K 2201/09236* (2013.01); *H05K 2201/09745* (2013.01); *Y10T 29/49117* (2015.01); *Y10T 29/49126* (2015.01); *Y10T 29/49128* (2015.01); *Y10T 29/49156* (2015.01); *Y10T 29/49165* (2015.01)

(56) References Cited

U.S. PATENT DOCUMENTS

| | | | |
|---|---|---|---|
| 5,326,623 A | 7/1994 | Yamakawa et al. | |
| 5,360,887 A | 11/1994 | Tsunemi et al. | |
| 5,363,550 A | 11/1994 | Aitken et al. | |
| 5,418,504 A * | 5/1995 | Nottenburg | H01P 3/081 333/1 |
| 5,421,083 A | 6/1995 | Suppelsa et al. | |
| 5,745,984 A | 5/1998 | Cole, Jr. et al. | |
| 5,906,042 A | 5/1999 | Lan et al. | |
| 6,004,657 A | 12/1999 | Moriyasu et al. | |
| 6,137,064 A * | 10/2000 | Kiani | H05K 1/0222 174/261 |
| 6,373,740 B1 | 4/2002 | Forbes et al. | |
| 6,569,757 B1 | 5/2003 | Weling et al. | |
| 6,618,238 B2 | 9/2003 | Sanville, Jr. | |
| 6,630,627 B1 * | 10/2003 | Tobita | H05K 1/0219 174/255 |
| 6,941,649 B2 | 9/2005 | Goergen | |
| 6,988,162 B2 | 1/2006 | Goergen | |
| 7,062,850 B2 | 6/2006 | Atakov et al. | |
| 7,223,687 B1 | 5/2007 | Ho et al. | |
| 7,235,457 B2 | 6/2007 | Forbes et al. | |
| 7,253,788 B2 * | 8/2007 | Choi | H01Q 15/006 343/754 |
| 7,417,872 B2 | 8/2008 | Li et al. | |
| 7,448,880 B2 | 11/2008 | Osaka | |
| 7,545,233 B2 | 6/2009 | Lin et al. | |
| 7,663,890 B2 | 2/2010 | Nelson et al. | |
| 7,999,192 B2 | 8/2011 | Chan et al. | |
| 8,089,107 B2 | 1/2012 | Okubora | |
| 8,168,891 B1 * | 5/2012 | Goergen | H01P 3/081 174/255 |
| 8,304,659 B2 | 11/2012 | Goergen | |
| 2002/0020917 A1 * | 2/2002 | Hirota | H01L 23/5222 257/758 |
| 2003/0179741 A1 * | 9/2003 | Goergen | H04Q 1/10 370/351 |
| 2004/0178000 A1 | 9/2004 | Tseng | |
| 2005/0139391 A1 * | 6/2005 | Li | H01L 23/49822 174/262 |
| 2005/0190587 A1 * | 9/2005 | Greeff | H01P 3/081 365/51 |
| 2005/0205292 A1 * | 9/2005 | Rogers | H05K 1/0231 174/255 |
| 2006/0290438 A1 * | 12/2006 | Greeff | H01P 3/081 333/1 |

\* cited by examiner

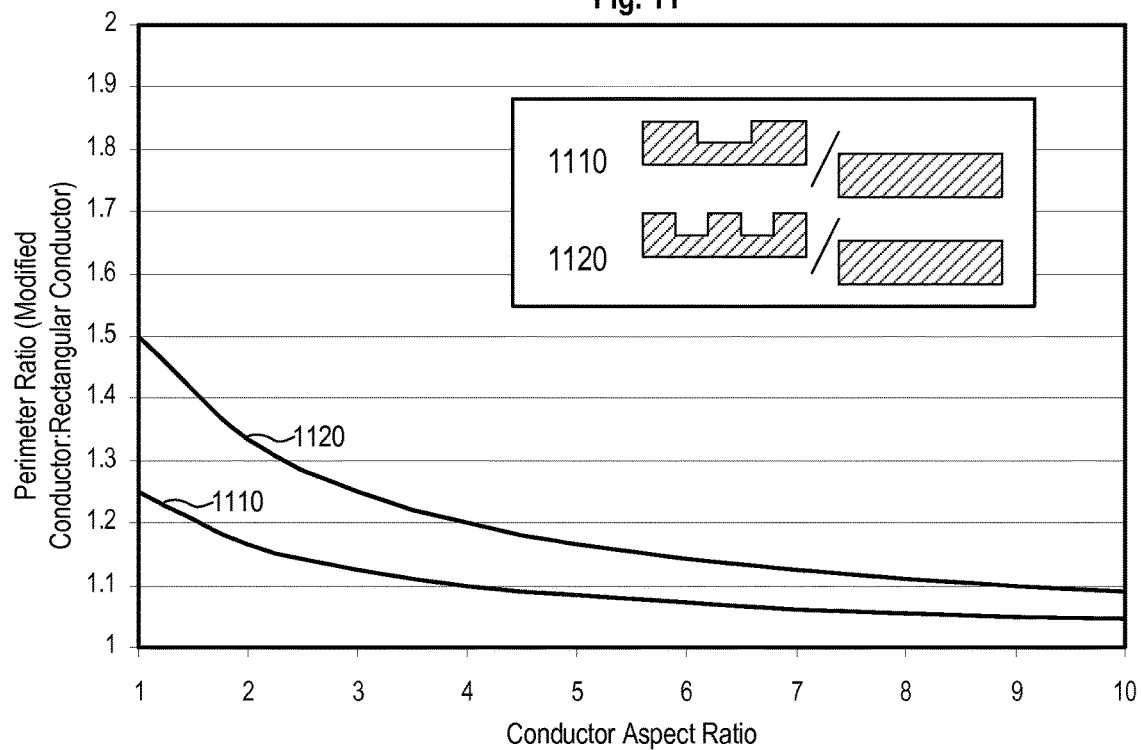
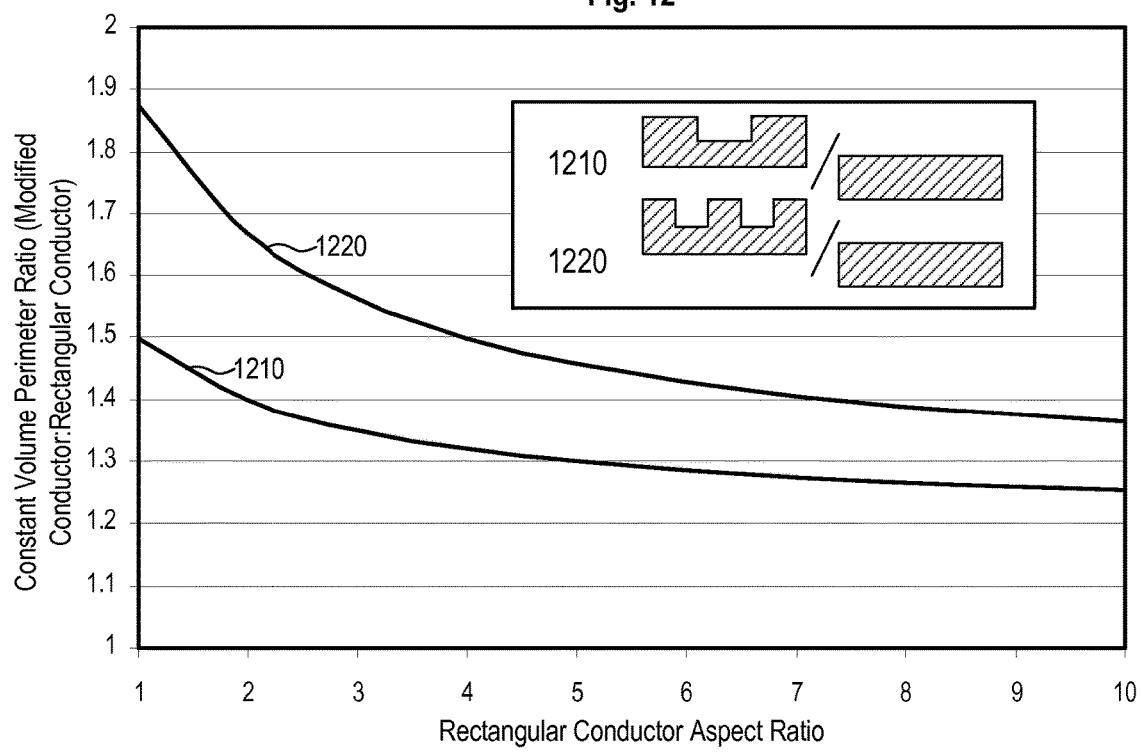

CIRCUIT BOARD

CROSS-REFERENCE TO RELATED APPLICATIONS

The application is a continuation of U.S. application Ser. No. 12/961,610, filed on Dec. 7, 2010, which is a divisional of U.S. application Ser. No. 12/151,088, filed May 2, 2008, now U.S. Pat. No. 8,168,891, which is a Continuation-In-Part of U.S. application Ser. No. 11/977,783, filed on Oct. 26, 2007, now U.S. Pat. No. 8,304,659, all of which are incorporated herein by reference in their entirety.

FIELD OF THE INVENTION

This invention relates generally to printed circuit boards, and more specifically to high-speed trace configurations for such circuit boards and methods of manufacturing such configurations.

BACKGROUND OF THE INVENTION

Electronic assemblies commonly employ one or more printed circuit boards in their construction. Such circuit boards provide mounting points for electronic components and/or for sockets that allow other circuit boards, cables, or device packages to connect to the circuit board. The circuit board provides conductive traces, and possibly planar conductive regions, patterned on conductive layers sandwiched between insulating dielectric layers. A typical circuit board may contain anywhere from a few conductive layers to upwards of thirty such layers for complex systems. Conductive traces route signals (and possibly power) from one point on the circuit board to another point on the circuit board. Planar conductive regions are employed for power distribution. Planar conductive regions also serve as reference planes, which when coupled through a dielectric layer to one of the conductive traces or a differential pair of such traces, form stripline transmission lines of specific impedance. Plated through-holes (PTHs) in the circuit board can form mounting points for press-fit devices, allow for signal insertion/extraction to the internal board layers, and can also serve as layer-swapping vias that transfer a signal from a trace on one conductive layer to another trace on another conductive layer.

FIGS. 1A and 1B illustrate a circuit board portion 100 containing some common structures found within the internal layers of a printed circuit board. The cross-section of FIG. 1B shows three traces 110, 120, 130 on a common conductive layer, four dielectric layers 134, 136, 140, and 142, and conductive plane layers 160 and 170. It is understood that other layers above and below these layers can exist in a complete circuit board. The plan view of FIG. 1A shows only the traces 110, 120, 130, the dielectric layer 140, and the conductive plane layer 160, which in circuit board portion 100 is coextensive with dielectric layer 140 except for the clearances 162, 164 indicated by hidden lines, where the plane layer 160 is removed so that it does not short to plated through-holes co-located with pads 112, 122, 114, and 124.

Traces 110 and 120 form a differential trace pair. The pair receives a signal pair at through-holes connected to pads 112 and 122, and propagates the signal to another pair of through-holes co-located with pads 114 and 124. The signals are differential with respect to the reference planes 160 and 170—at any point along the traces, the voltage on trace 110 will have approximately the opposite polarity and the same magnitude as the voltage on trace 120, as referenced to the voltage on planes 160 and 170. The impedance of the configuration is determined by the differential coupling of the electromagnetic (EM) fields between the two traces and the single-ended coupling of each trace to planes 160 and 170. The spacing between the traces, spacing between the trace layer and the plane layers, and trace size are adjusted to achieve a desired characteristic impedance. Such trace pairs are commonly used to transmit high-speed signals (digital symbol rates greater than 1 billion symbols/second) between a source component and a receiver component.

Trace 130 is a single-ended trace. Such a trace is routed at a distance from the differential pair and other conductors (not shown) such that its characteristic impedance is dominated by its single-ended coupling to reference planes 160 and 170. Such traces are generally used for lower-speed signals, where the performance of a differential pair is not required, to reduce space and componentry requirements.

Another feature shown in FIG. 1A is thieving, which comprises a pattern of dummy lands (see numbered dummy land 150) patterned on the same conductive layer as traces 110, 120, and 130. These lands are placed in large unused regions of a conductive layer to help preserve the planarity of the circuit board during construction.

BRIEF DESCRIPTION OF THE DRAWINGS

The invention may be best understood by reading the disclosure with reference to the drawing, wherein:

FIGS. 11 and 12 plot perimeter ratios comparing two embodiments to a rectangular conductor.

DETAILED DESCRIPTION OF THE PREFERRED EMBODIMENTS

As signaling frequencies increase, stripline conductor behavior changes. For signal components above about 400 MHz, the "skin effect" becomes significant. The skin effect causes signal current to move disproportionately toward the outer surface of a conductor with increasing frequency. For signal frequency components above about 6 GHz, the skin effect phenomenon causes the majority of the signal to be carried in the outer 15% of the conductor, which effectively raises the resistivity of the trace at high frequency. Also, as signaling frequencies increase, more and more of the signal is radiated into the surrounding dielectric material and lost. Due in large part to these effects, the transmission of signal components at frequencies higher than 10 GHz across a differential pair longer than a few inches is difficult.

Figure 1A:
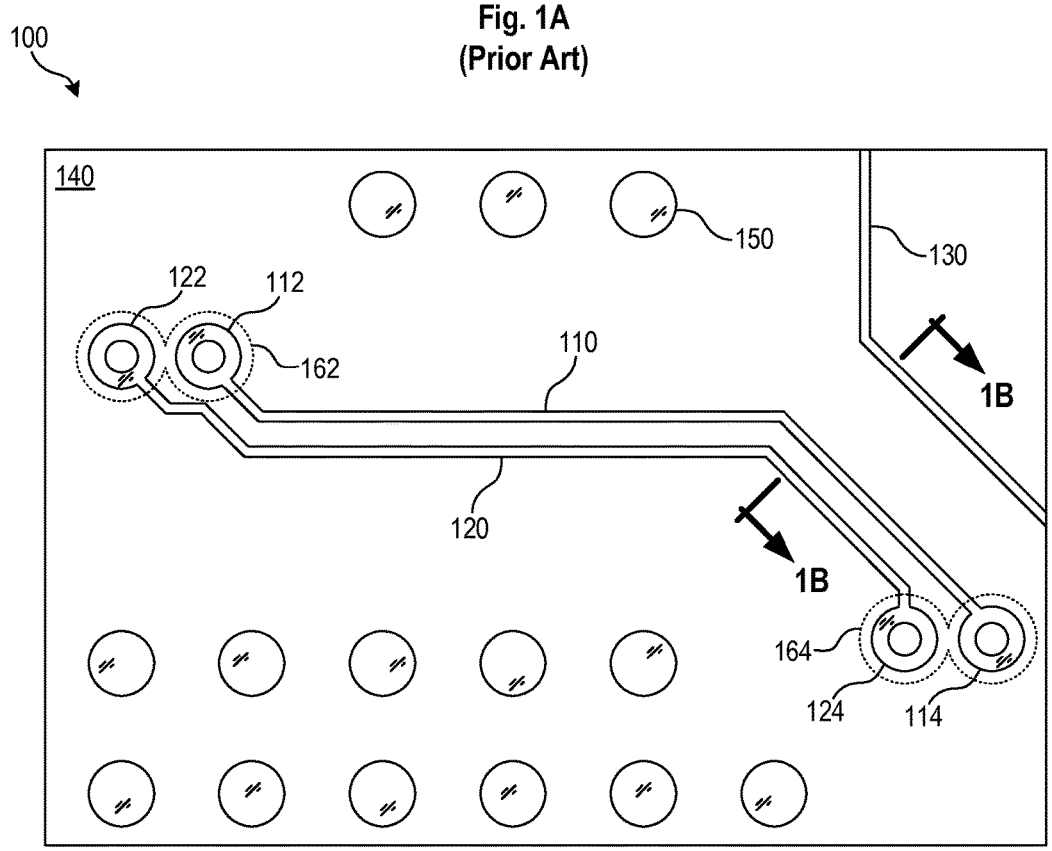
FIGS. 1A and 1B illustrate, respectively, a plan view and cross-section of a portion of a prior art circuit board.
Figure 1B:
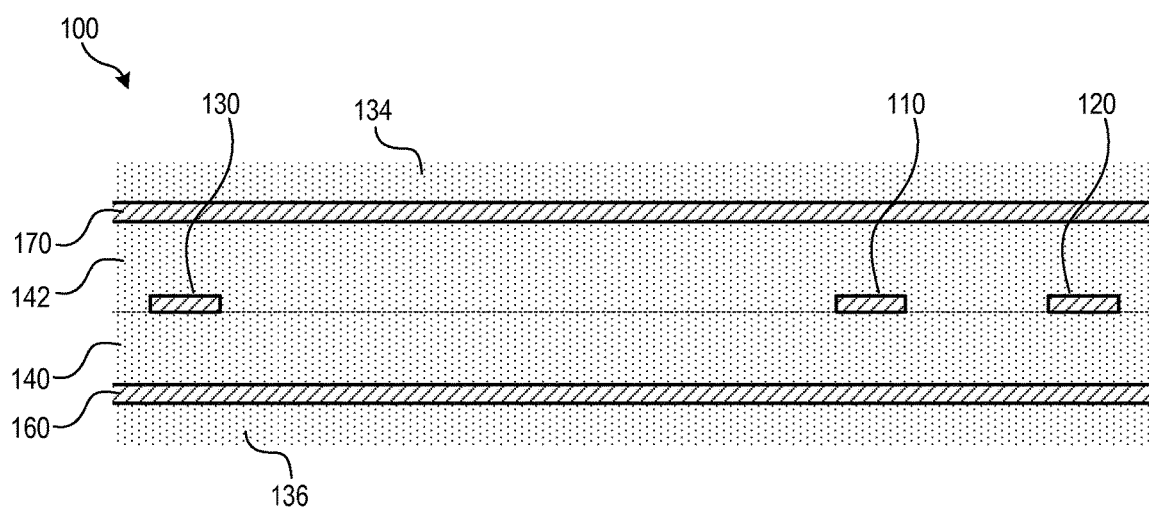

Traditional stripline conductors, such as those shown in FIGS. 1A and 1B, are substantially rectangular in cross-section. In contrast, the embodiments described below use alternative stripline conductor cross-sections that increase the cross-sectional perimeter of the conductor as compared to the cross-sectional perimeter of a rectangular conductor of similar width and height, and/or as compared to the cross-sectional perimeter of a rectangular conductor of similar cross-sectional volume and width. The increase in perimeter is believed to decrease the resistivity of the stripline conductor at high frequency, due to an increase in peripheral volume of the conductor.

Figure 2A:
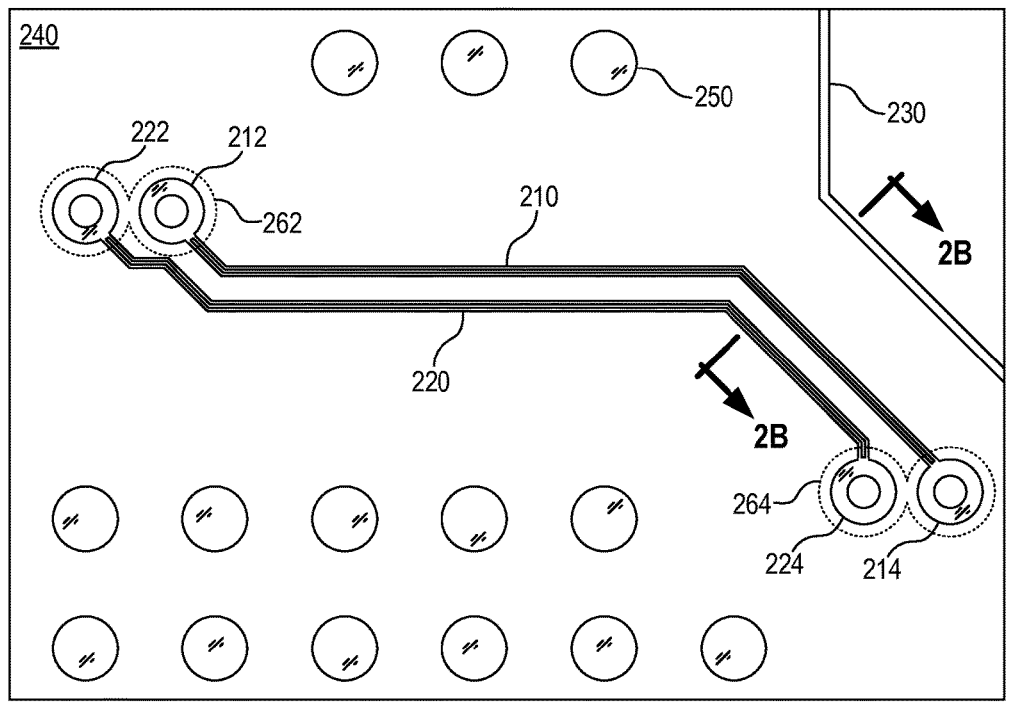
FIGS. 2A and 2B illustrate, respectively, a plan view and cross-section of a portion of a circuit board according to an embodiment.
Figure 2B:
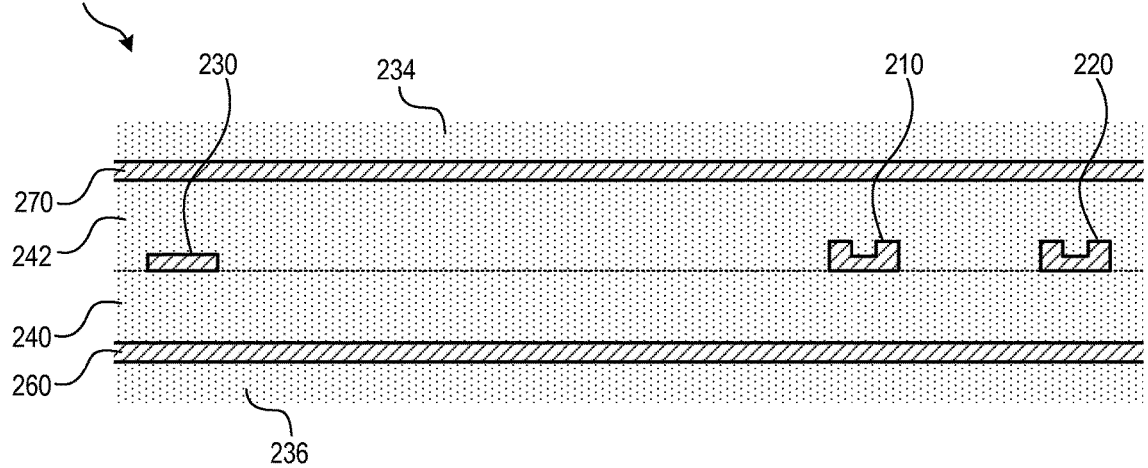

FIGS. 2A and 2B illustrate a circuit board portion 200 similar to circuit board portion 100 shown in FIGS. 1A and 1B, but incorporating aspects of an embodiment. Referring first to FIG. 2B, a cross-section of circuit board portion shows a differential conductor pair 210, 220 and a single-ended conductor 230, sandwiched between two dielectric layers 240 and 242. A ground plane layer 260 abuts the underside of dielectric layer 240, and a ground plane layer 270 abuts the top side of dielectric layer 242. This assembly is sandwiched between additional dielectric layers 234 and 236, which can abut other layers (not shown) of a multi-layer circuit board.

Differential conductors 210 and 220 have a channeled profile made, e.g., according to one of the embodiments to be described below. As shown in the plan view of FIG. 2A, the channeled profile for conductors 210, 220 extends respectively from a first pair of through holes co-located with pads 212, 222 to a second pair of through holes co-located with pads 214, 224. The channeled profile increases the cross-sectional area near the surface of the conductor, lowering resistivity at high frequency, without broadening the conductors (which both reduces routing area and requires thicker dielectric layers to achieve the same single-ended impedance). In this embodiment, the pads 212, 214, 222, and 224 are the same thickness as the conductors 210, 220.

Other structures on the same layer as differential conductors 210 and 220 can include, as illustrated, a single-ended conductor 230 and a thieving pattern. The metal in the thieving pattern (exemplified by thieving structure 250) can either be the thickness of the pads 212, etc., or can be the thickness of single-ended conductor 230. The single-ended conductor 230 need not be the height shown—in other implementations, it can either be the thickness of traces 210, 220, or can even be formed with a channeled profile like traces 210, 220. A typical trace layer will also contain other differential pairs and/or single-ended traces, which are not illustrated so that the specifics of the exemplary structures are visible.

Figure 3A:
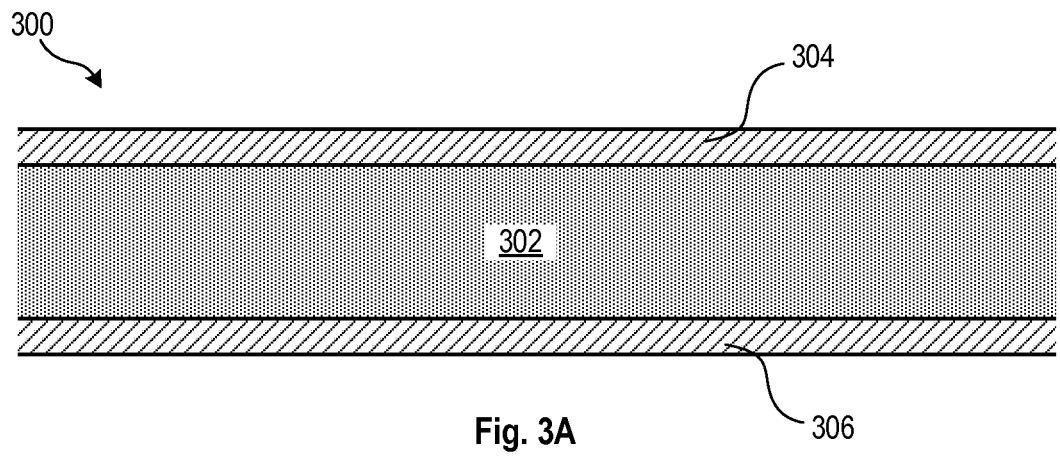
FIGS. 3A to 3K show steps in the fabrication of a circuit board containing a differential pair according to an embodiment.

FIGS. 3A-3K illustrate steps in constructing a circuit board according to one embodiment. FIG. 3A shows, in cross-section, a portion of one subassembly 300 of a circuit board. Subassembly 300 includes a dielectric core 302 with one conductive layer 304 bonded to its top and another conductive layer 306 bonded to its bottom. The dielectric core 302 can have, in one embodiment, a nominal thickness of 6 to 7 mils, with the conductive layers having a nominal thickness of 1.4 mils (equivalent to the thickness of one-ounce per square foot ("one ounce") copper foil). Dielectric core 302 can be formed, e.g., using two sheets of Isola IS620 glass style 2113H with 52% resin content, or two sheets of Nelco N4000-13EP glass style 1080 with 55% resin content. Conductive layers 304 and 306 can be formed, e.g., from less expensive copper having a conductivity of $58.00 \times 10^7$ S/m, or higher purity copper having a conductivity of $5.961 \times 10^7$ S/m.

Figure 3B:
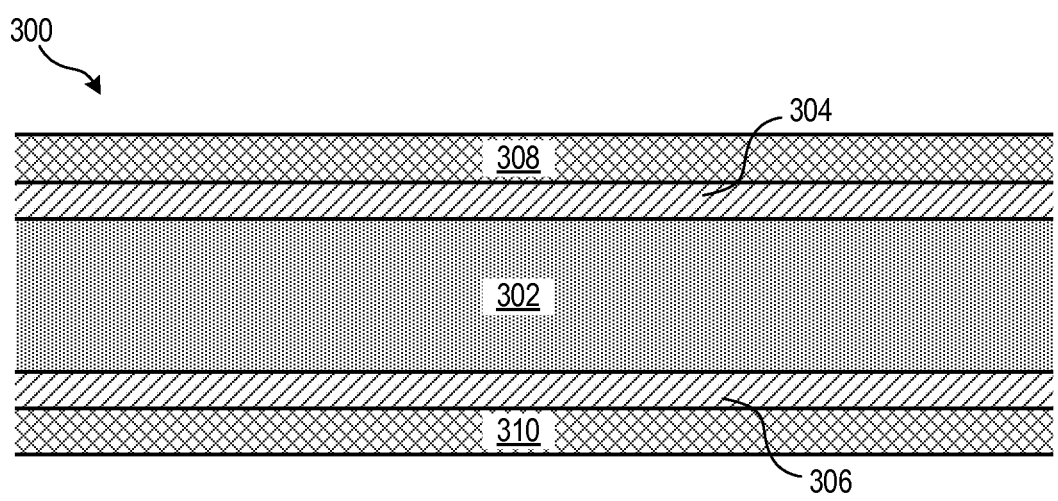
Figure 3C:
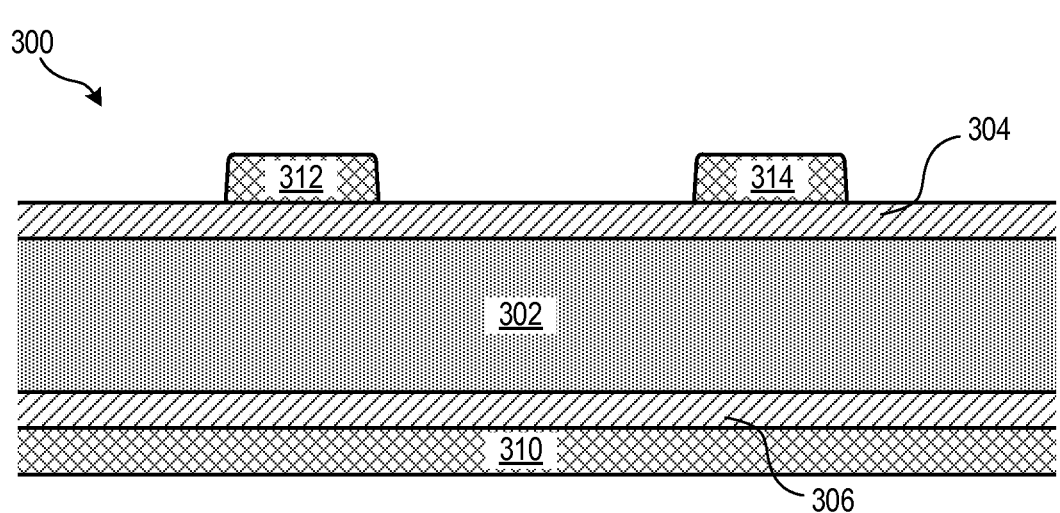

In FIG. 3B, a mask layer, e.g., made of a photoresist material, is applied to both sides of subassembly 300, forming a coating 308 on conductive layer 304 and a coating 310 on conductive layer 306. Mask layer 308 is exposed to a pattern, developed, and rinsed, to leave a mask pattern comprising features 312 and 314 of FIG. 3C. As layer 306 is to form a reference plane layer at this portion of the subassembly, no corresponding mask pattern is depicted for mask layer 310. Mask layer 310 will, however, have openings in areas not shown in FIG. 3C, to allow for clearances in the reference plane layer that will be used for signal through holes and vias, for example.

Figure 3D:
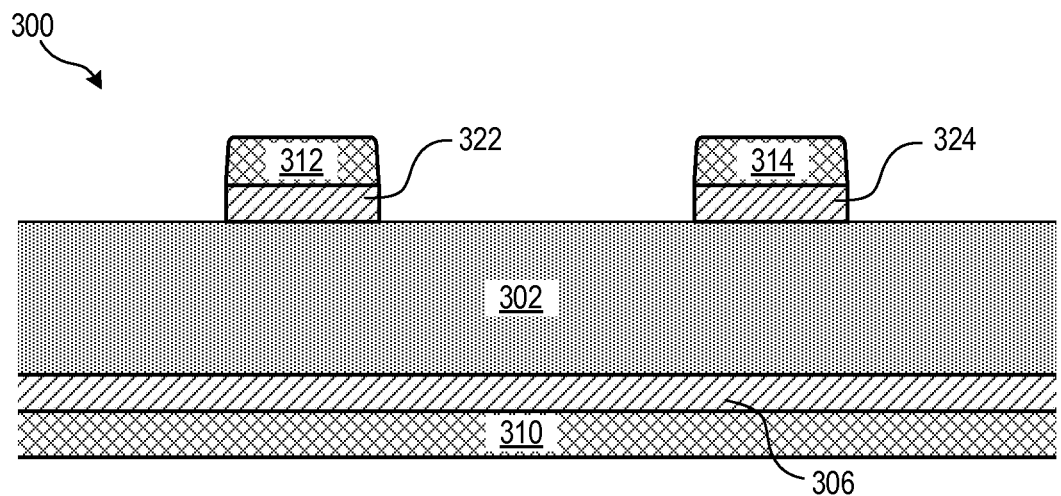

In FIG. 3D, an etch process is used to remove the conductive layers from dielectric core 302, wherever the mask pattern does not remain to protect the underlying conductive material. Thus in the portion of subassembly 300 shown, all of conductive layer 304 is removed except for two conductive traces 322 and 324, with traces widths of approximately 6 mils, directly underlying mask pattern features 312 and 314, respectively.

Figure 3E:
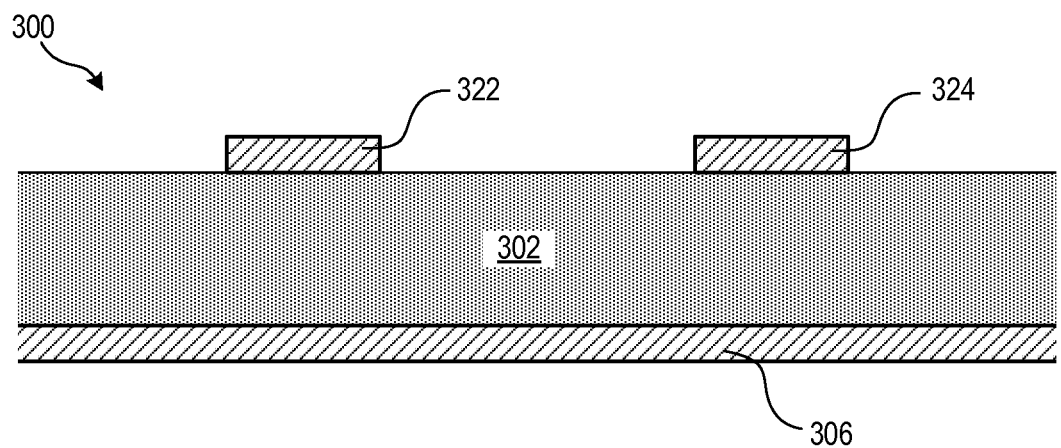
Figure 3F:
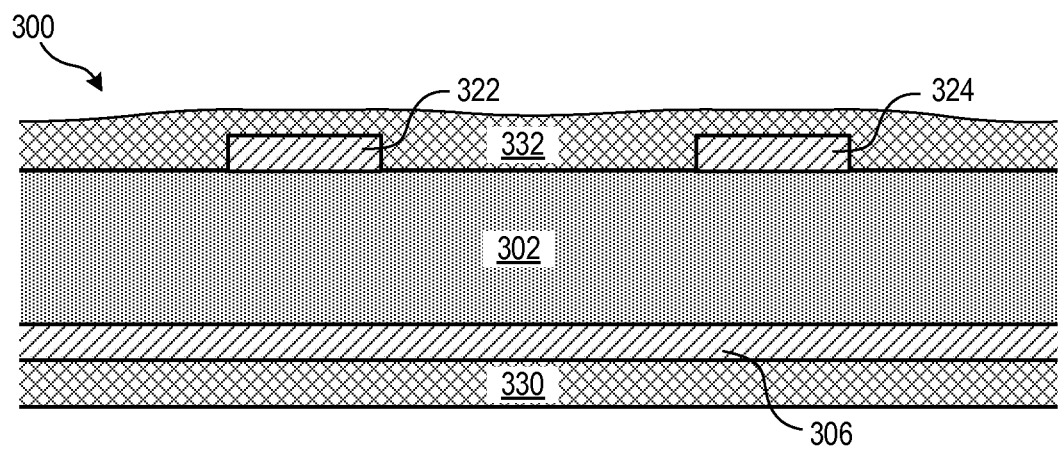

FIG. 3E illustrates that subassembly 300 is then cleaned to remove the masking pattern 310, 312, 314. As shown in FIG. 3F, a new mask layer is applied to both sides of the subassembly 300, forming a coating 330 on reference plane layer 306, and a coating 332 on conductive traces 322 and 324 and the exposed portions of dielectric core 302.

Figure 3G:
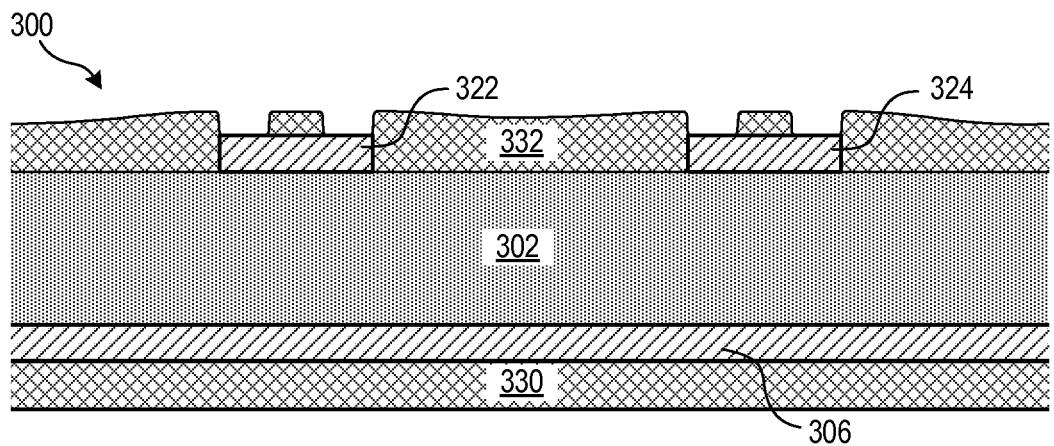

Mask layer 332 is exposed to a pattern, developed, and rinsed, to leave the mask pattern shown in FIG. 3G. This mask pattern exposes the top portion of conductive traces 322 and 324, except for a central lengthwise section where a channel is to exist in the finished subassembly. For a 6-mil conductor width, a 2-mil mask pattern is left running down the center of conductive traces 322 and 324. Mask layer 330 is left intact.

Figure 3H:
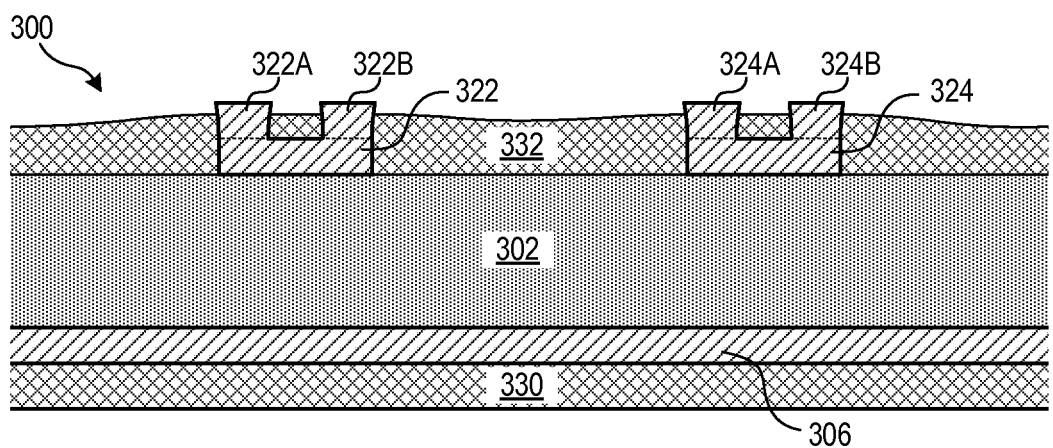

Next, subassembly 300 is subjected to a process, such as an electroplating process, that adds height to the exposed portions of conductors 322 and 324. As depicted in FIG. 3H, this extends the sides 322A, 322B of conductor 322 and the sides 324A, 324B of conductor 324 upwards some desired distance, such as 1.4 mils for the 1.4-mil conductor bases shown. The additional conductive material added by plating can be copper. Alternately, the final portion of the plating (e.g., equivalent to the skin depth at 400 MHz) can use silver plating, with a conductivity of $63.01 \times 10^7$ S/m.

Figure 3I:
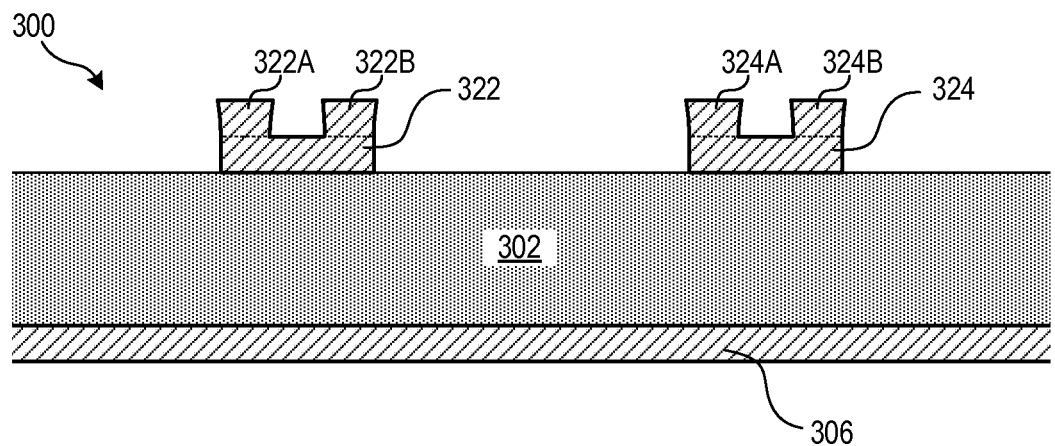

FIG. 3I illustrates that subassembly 300 is then cleaned to remove the masking pattern 332 and masking layer 330. Subassembly 300 is then ready to be joined with other layers to form the circuit board.

Figure 3J:
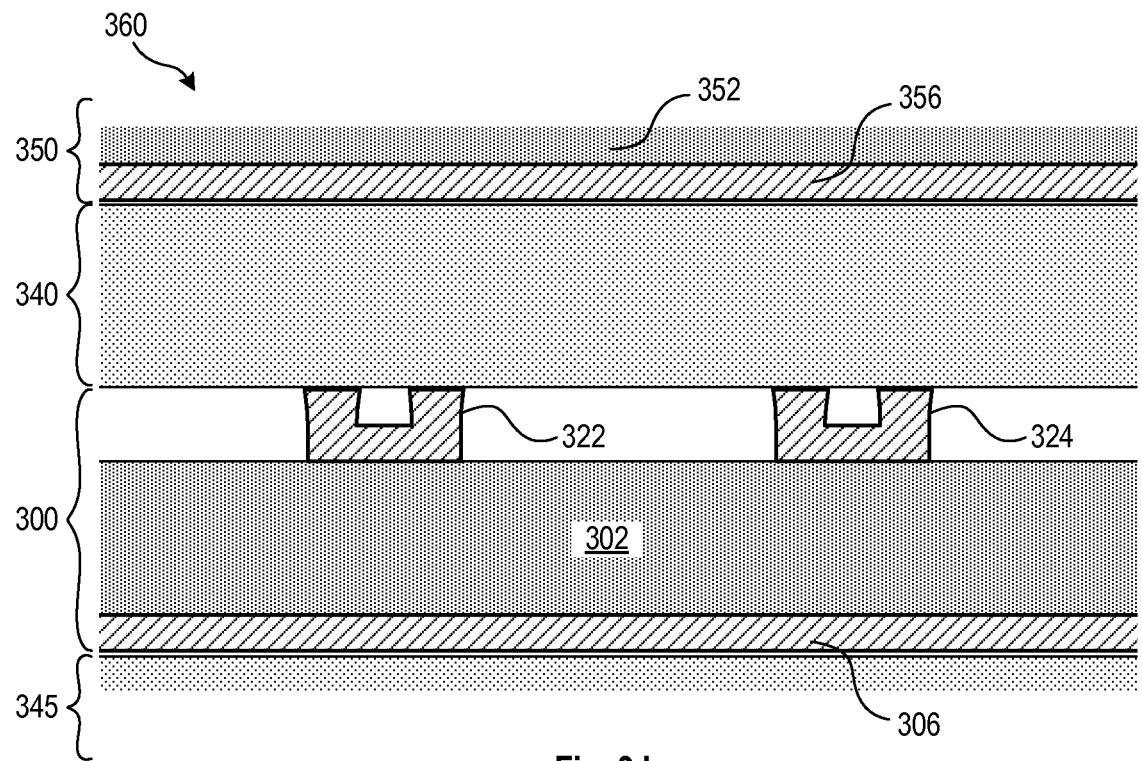
Figure 3K:
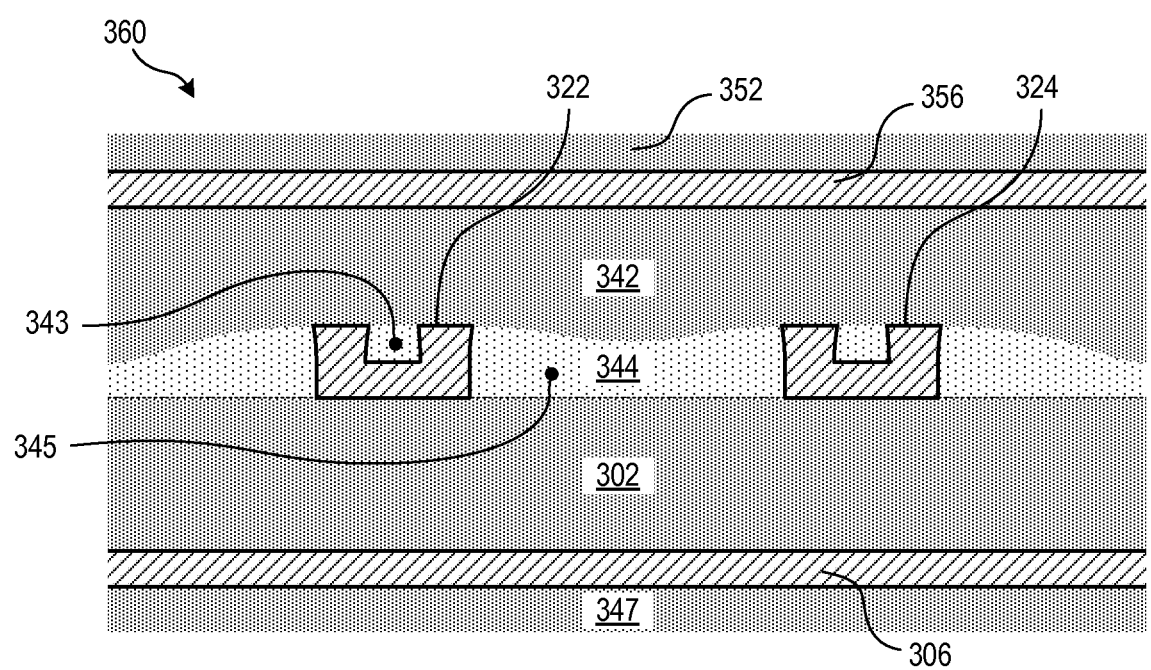

FIG. 3J shows subassembly 300 aligned with other parts of a circuit board 360 for assembly. Layer 340 comprises one or more sheets of an uncured resin-impregnated woven fiber dielectric material, such as two sheets of Isola IS620 glass style 2113 with 58.2% resin content, or two sheets of Nelco N4000-13EP glass style 1080 with 65% resin content. Layer 345 is similar. Subassembly 350 comprises a dielectric core 352 and reference plane layer 356, with, e.g., an upper conductive trace layer (not shown) with or without channeled traces. Other layers and subassemblies may exist above and below those shown in FIG. 3J.

After alignment, the components of circuit board 360 are held together under pressure and heated to bond them together. This allows resin to flow from layer 340 to fill voids such as the lengthwise channels in conductors 322 and 324, as exemplified by the FIG. 3K resin-rich area 343 in the lengthwise channel of conductor 322. Depending on the separation between conductors 322 and 324, the woven fiber dielectric material may or may not descend completely into the space between two conductors. If it does not, a resin-rich area 345 may exist between conductors 322 and 324 as well.

After curing, the previously uncured material 340 can be envisioned as existing in a low-resin-content (and therefore woven-fiber-rich) region 342 and a resin-rich region 344. Although these regions may grade together in the areas adjacent conductors 322 and 324, the boundary between regions 342 and 344 is fairly distinct at the top of the lengthwise channels in conductors 322 and 324. The woven fiber dielectric material is tightly compressed above conductors 322 and 324, as resin is forced from the uncured sheets to keep the board substantially planar. Due to the narrowness of the channels, the woven fiber dielectric material is not displaced into the channels, such that region 343 is substantially all resin.

In a preferred embodiment, resin-rich region 343 has a lower dielectric constant than low-resin-content region 342 directly above conductors 322 and 324. It is now believed that the resulting dielectric constant discontinuity atop the channel, coupled with the channel itself, can produce a waveguide effect at high frequencies, causing signal components to propagate along the lengthwise channels in the low-dielectric constant region 343, and therefore reducing the amount of transverse signal loss into the dielectric material.

Conductors 322 and 324 are arranged as an edge-coupled differential pair, positioned between reference (e.g., digital ground) planes 306 and 356. The size, height, and spacing of the conductors can be adjusted to adjust the differential coupling between the conductors. The spacing between the conductors and each of planes 306 and 356 can be adjusted to adjust the single-ended coupling from each of the conductors to the reference planes. It is noted that due to the existence of the channels and corresponding difference in coupling fields at the top and bottom of the conductors, the spacing between the bottom of conductors 322 and 324 and reference plane 306 may be different from the spacing between the top of conductors 322 and 324 and reference plane 356.

Figure 4A:
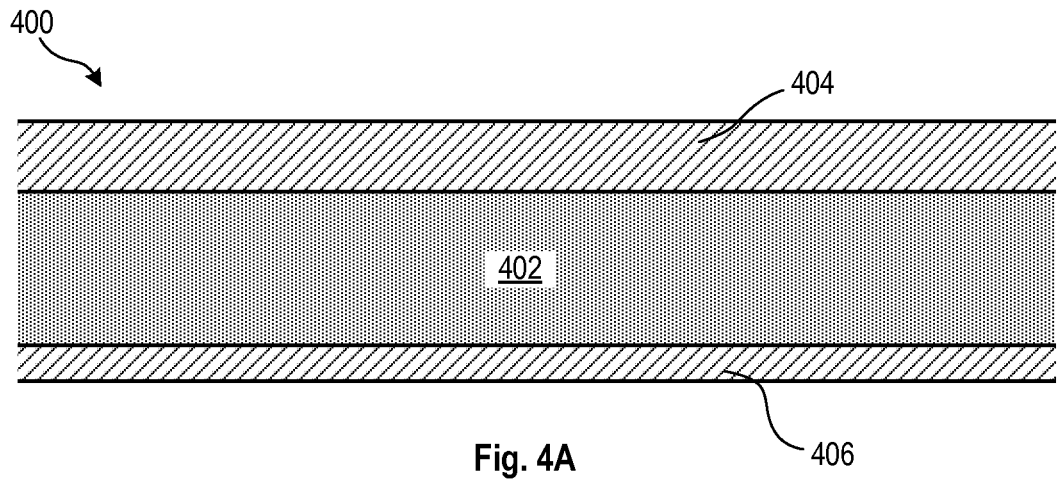
FIGS. 4A to 4I show steps in the fabrication of a circuit board containing a differential pair according to another embodiment.

FIGS. 4A-4I illustrate steps in constructing a circuit board according to another embodiment. FIG. 4A shows, in cross-section, a portion of one subassembly 400 of a circuit board. Subassembly 400 is similar to subassembly 300 in FIG. 3A, as it includes a dielectric core 402 with one conductive layer 404 bonded to its top and another conductive layer 406 bonded to its bottom. The primary difference between the two subassemblies is that conductive layer 404 has a nominal thickness of 2.8 mils (equivalent to 2-ounce copper) instead of 1.4 mils.

Figure 4B:
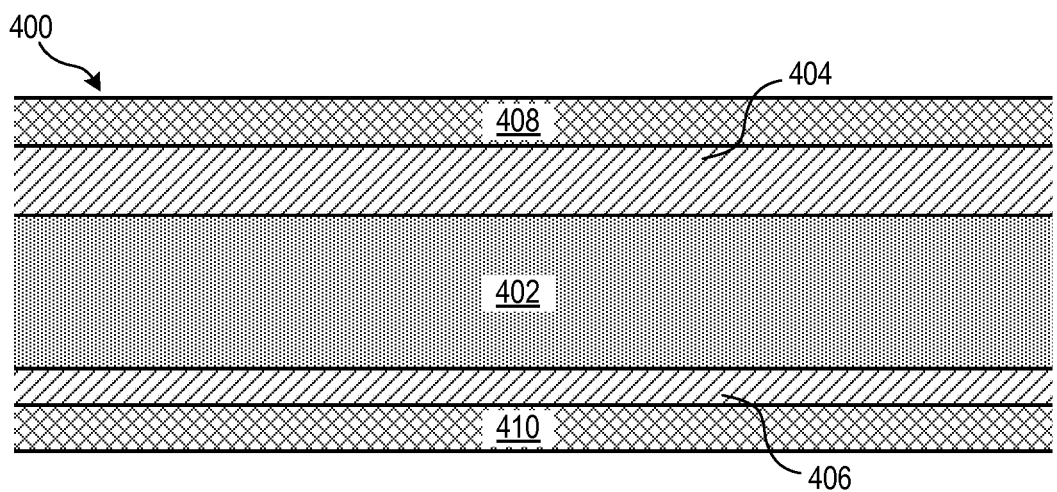
Figure 4C:
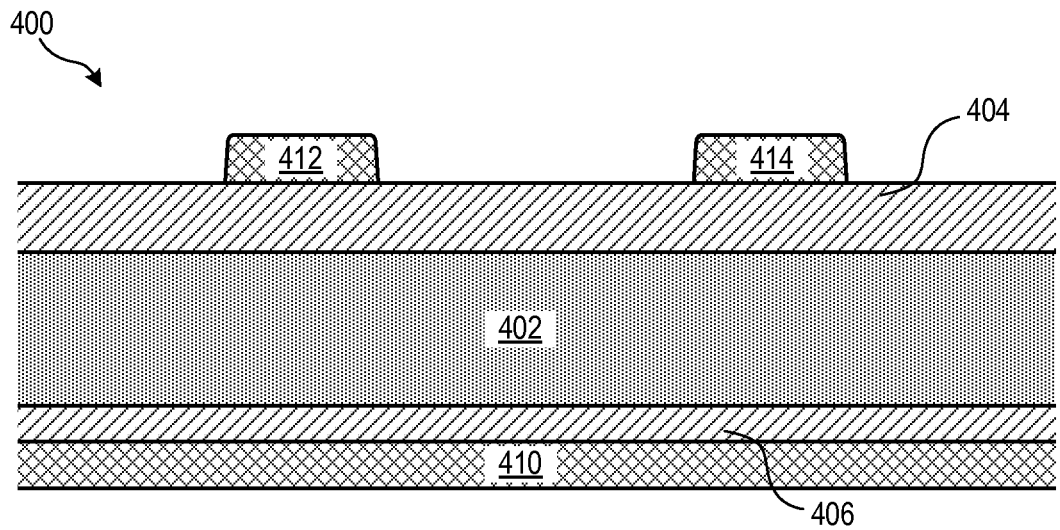

In FIG. 4B, a mask layer, e.g., made of a photoresist material, is applied to both sides of subassembly 300, forming a coating 408 on conductive layer 404 and a coating 410 on conductive layer 406. Mask layer 408 is exposed to a pattern, developed, and rinsed, to leave a mask pattern comprising features 412 and 414 of FIG. 4C. As layer 406 is to form a reference plane layer at this portion of the subassembly, no corresponding mask pattern is depicted for mask layer 410. Mask layer 410 will, however, have openings in areas not shown in FIG. 4C, to allow for clearances in the reference plane layer that will be used for signal through holes and vias, for example.

Figure 4D:
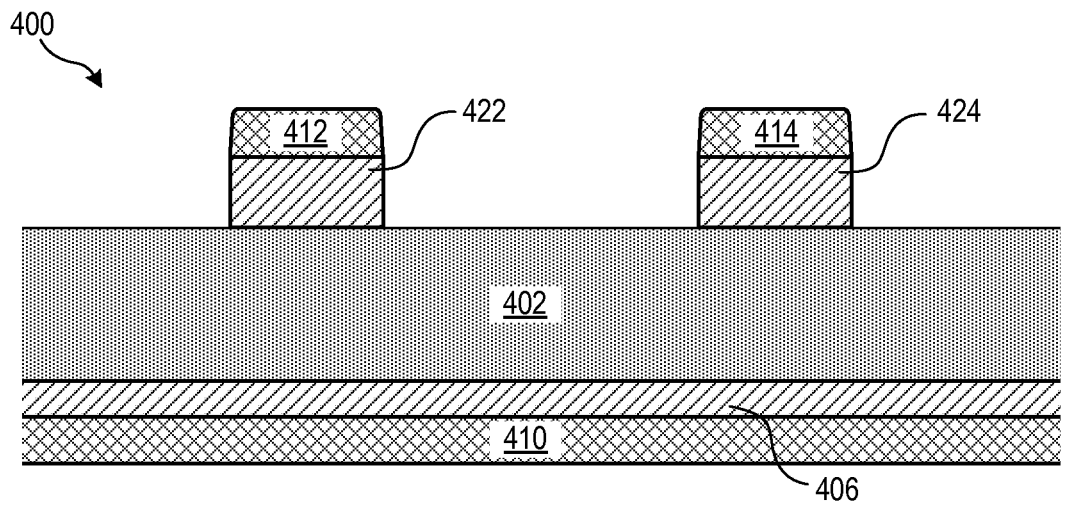
Figure 4E:
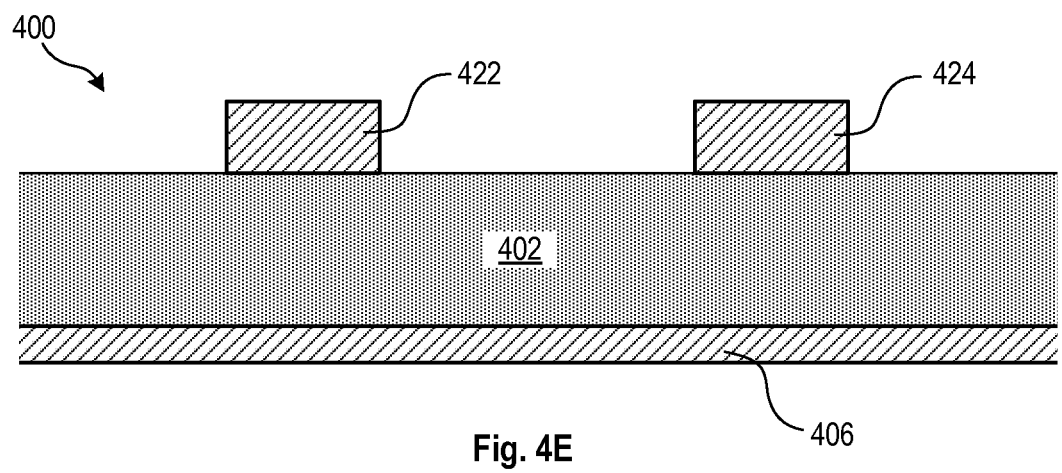

In FIG. 4D, an etch process is used to remove the conductive layers from dielectric core 402, wherever the mask pattern does not remain to protect the underlying conductive material. Thus in the portion of subassembly 400 shown, all of conductive layer 404 is removed except for two conductive traces 422 and 424, with traces widths of approximately 6 mils, directly underlying mask pattern features 412 and 414, respectively. FIG. 4E illustrates that subassembly 400 is then cleaned to remove the masking pattern 410, 412, 414.

Figure 4F:
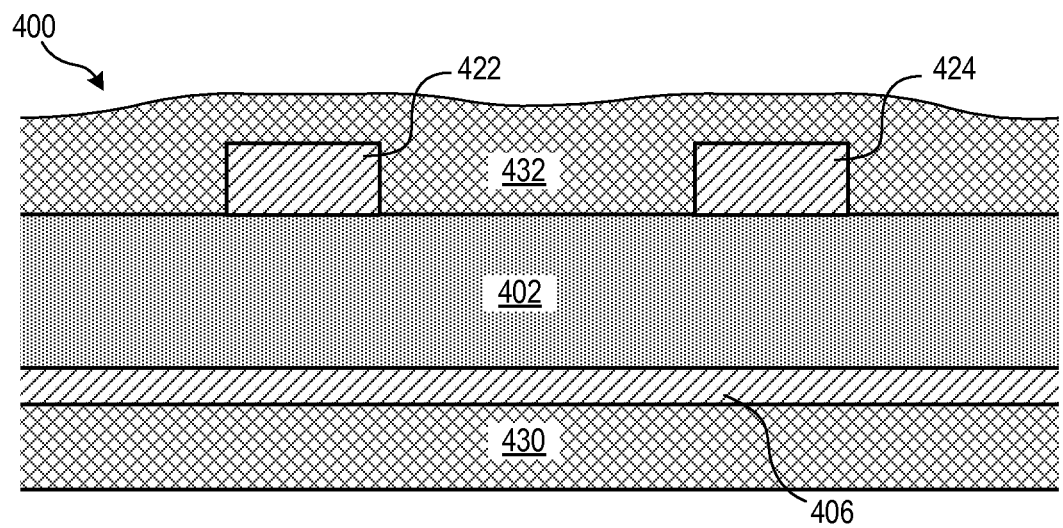

As shown in FIG. 4F, a new mask layer is applied to both sides of the subassembly 400, forming a coating 430 on reference plane layer 406, and a coating 432 on conductive traces 422 and 424 and the exposed portions of dielectric core 402.

Figure 4G:
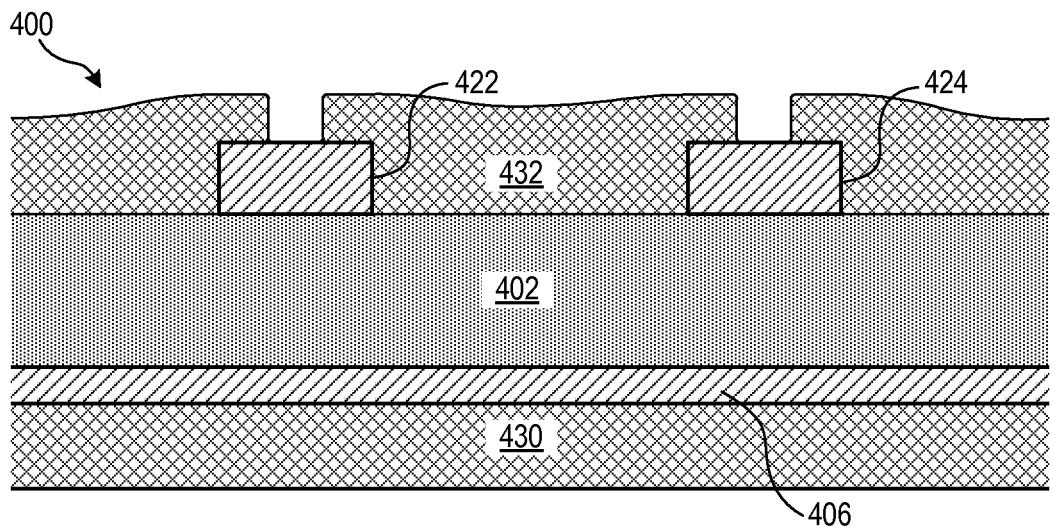

Mask layer 432 is exposed to a pattern, developed, and rinsed, to leave the mask pattern shown in FIG. 4G. This mask pattern exposes the top portion of conductive traces 422 and 424, in a central lengthwise section where a channel is to exist in the finished subassembly. For a 6-mil conductor width, the exposed portion forms a 2-mil-gap mask pattern running down the center of conductive traces 422 and 424. Mask layer 430 is left intact.

Figure 4H:
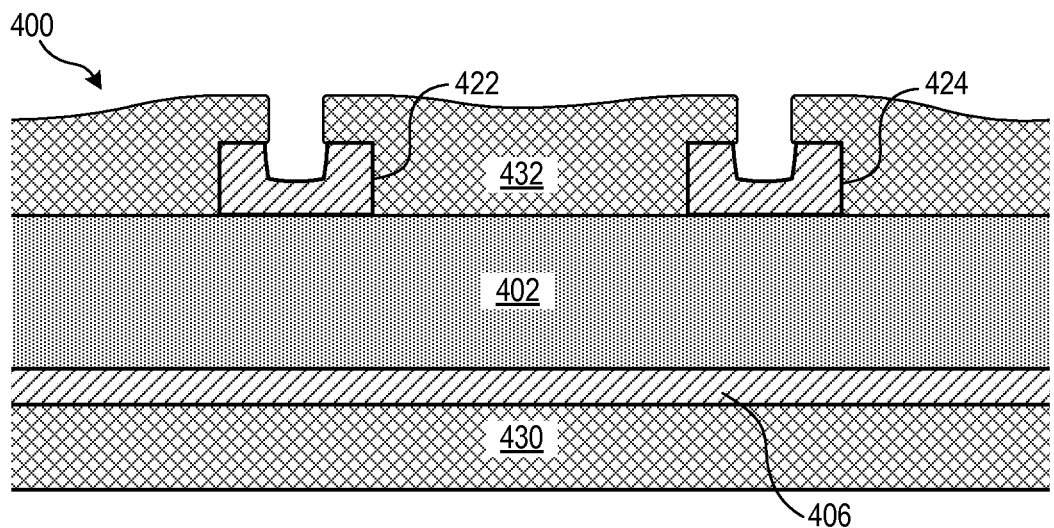
Figure 4I:
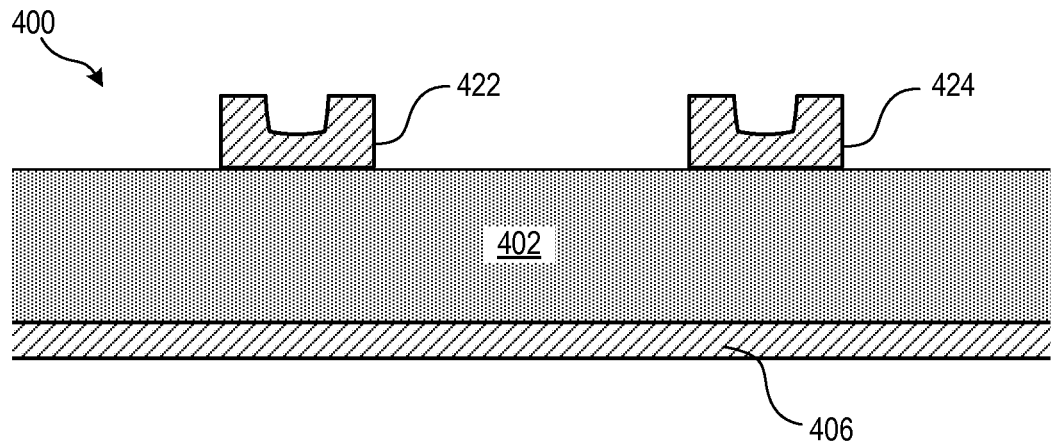

In FIG. 4H, a timed etch process is used to remove a portion of conductors 422 and 424, wherever the mask pattern does not remain to protect the underlying conductive material, to form lengthwise channels in the conductors. The nominal depth of the channels is half the height of the conductors. Finally, FIG. 4I illustrates that subassembly 400 is then cleaned to remove the masking pattern 430, 432. Subassembly 400 can then be used in a circuit board assembled, e.g., using the steps shown in FIGS. 3J and 3K.

Figure 5A:
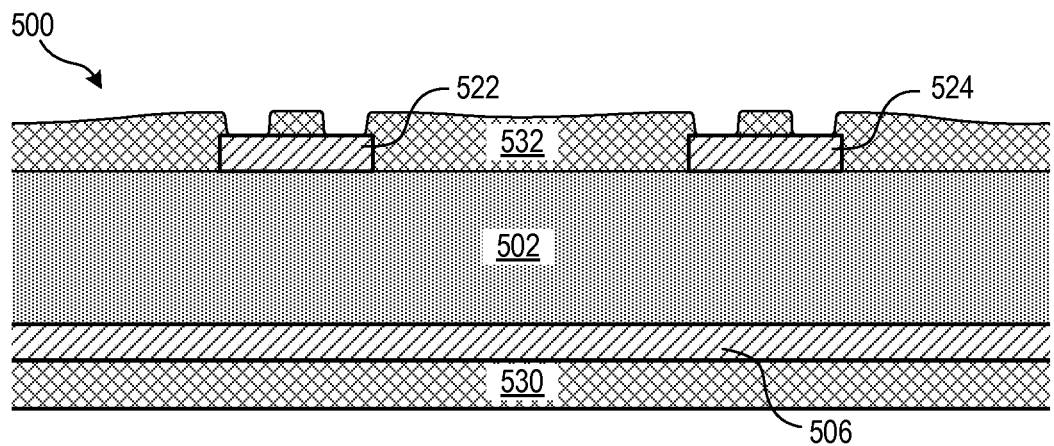
FIGS. 5A to 5C show steps in the fabrication of a circuit board containing a differential pair according to yet another embodiment.
Figure 5B:
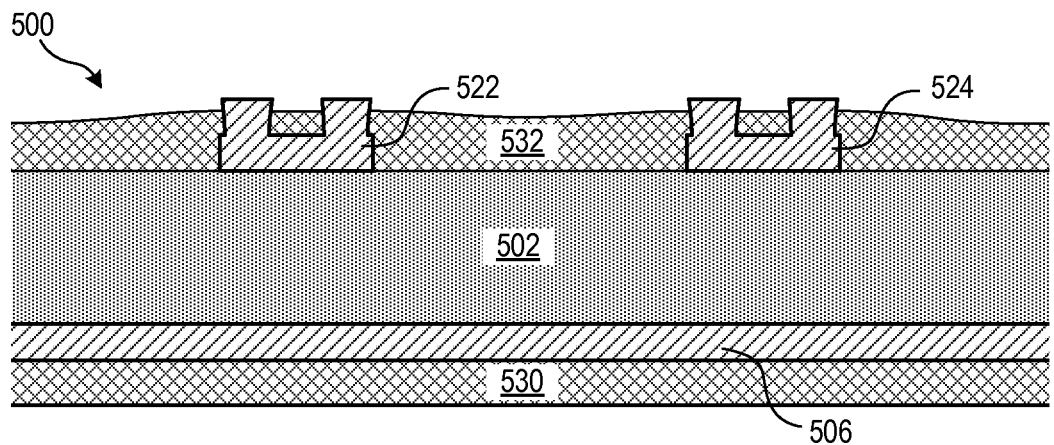
Figure 5C:
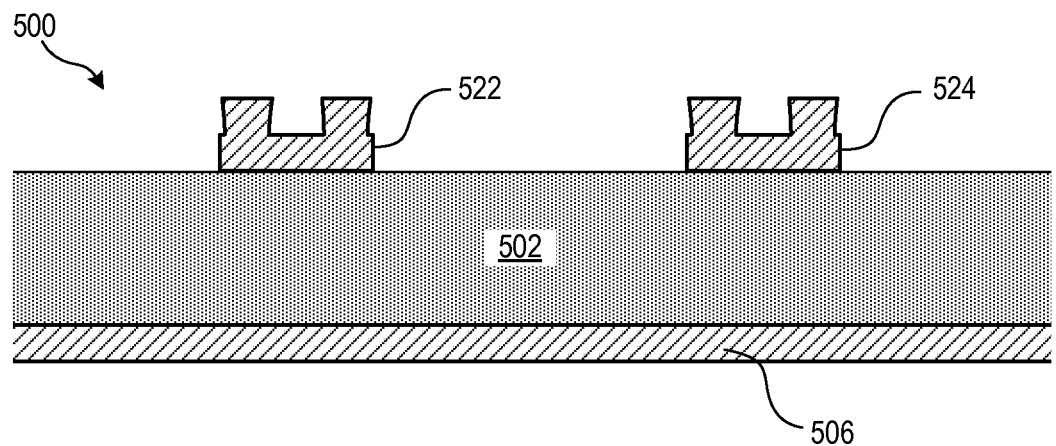

FIGS. 5A-5C illustrate steps in constructing a circuit board according to another embodiment. FIG. 5A shows, in cross-section, a portion of one subassembly 500 of a circuit board. Subassembly 500 is similar to subassembly 300 in FIG. 3G, as subassembly 500 includes a dielectric core 502 with two traces 522 and 524 bonded to its top and a reference conductive layer 506 bonded to its bottom. A mask pattern 532 exposes the top portion of conductive traces 522 and 524, in two lengthwise sections on each. A mask layer 530 deposited on reference conductive layer 506 is left intact.

The primary difference between the subassemblies of FIGS. 3G and 5A is that the openings in the mask pattern of FIG. 5A are not designed to align precisely at their outer edges with the edges of the conductor bases. Instead, the outer edges of the openings are moved towards the center of the conductor bases, e.g., by a distance equal to a mask alignment tolerance. Should the mask be misaligned but within the tolerance, no gap will exist in the mask at the edge of a conductor base.

Subassembly 500 is subjected to a process, such as an electroplating process, that adds height to the exposed portions of conductors 522 and 524. As depicted in FIG. 5B, this plating process creates side extensions on the conductive bases of conductors 522 and 524, the side extensions extending upwards some desired distance, such as 1.4 mils for the 1.4-mil conductor bases shown. Nominally, a small ledge will exist where the outer wall of each pillar meets the conductive base.

FIG. 5C illustrates that subassembly 500 is then cleaned to remove the masking pattern 532 and masking layer 530. Subassembly 500 can then be used in a circuit board assembled, e.g., using the steps shown in FIGS. 3J and 3K.

Figure 6A:
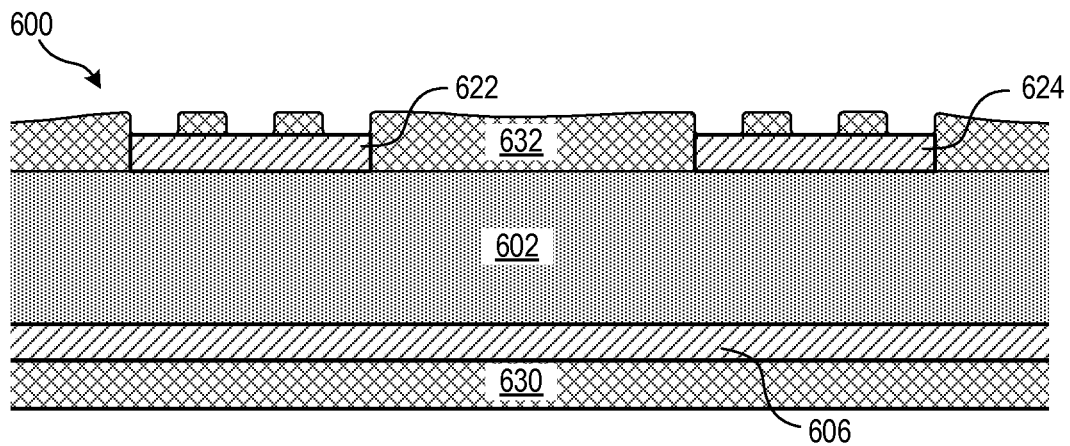
FIGS. 6A to 6C show steps in the fabrication of a circuit board containing a differential pair according to still another embodiment.
Figure 6B:
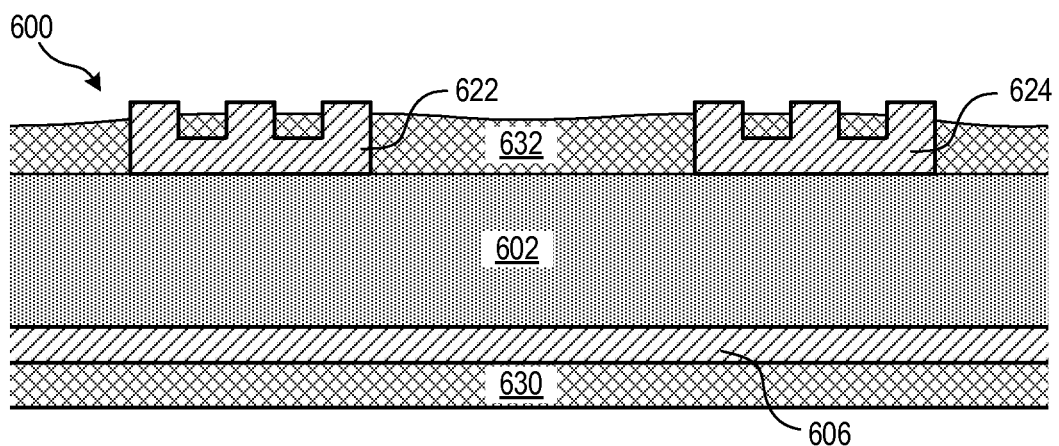
Figure 6C:
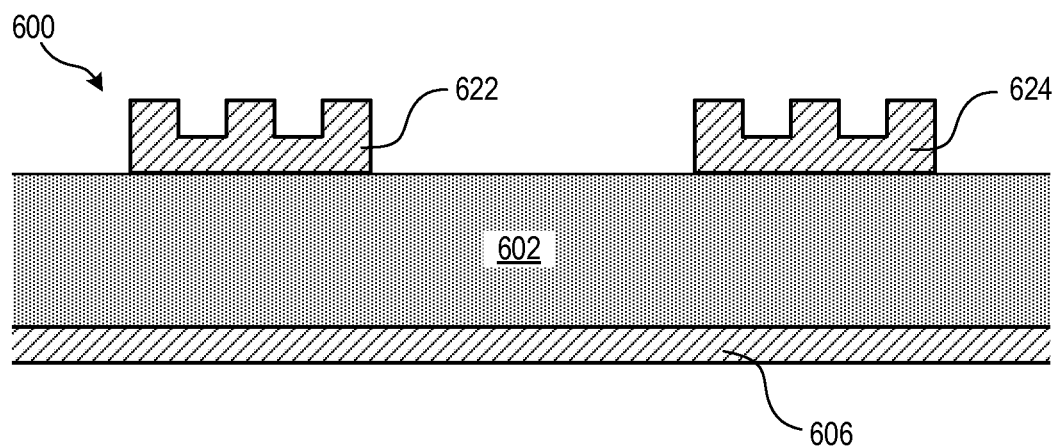

FIGS. 6A-6C illustrate steps in constructing a circuit board according to another embodiment. FIG. 6A shows, in cross-section, a portion of one subassembly 600 of a circuit board. Subassembly 600 is similar to subassembly 300 in FIG. 3G, as subassembly 600 includes a dielectric core 602 with two traces 622 and 624 bonded to its top and a reference conductive layer 606 bonded to its bottom. A mask layer 630 deposited on reference conductive layer 606 is left intact.

Two primary differences exist between the subassemblies of FIGS. 3G and 6A. First, the conductors in FIG. 6A are wider, e.g., as shown they have a 10-mil width. Second, a mask pattern 632 exposes the top portion of conductive traces 622 and 624, in three equally spaced lengthwise sections on each.

Subassembly 600 is subjected to a process, such as an electroplating process, that adds height to the exposed portions of conductors 622 and 624. As depicted in FIG. 6B, this plating process creates side extensions and a central ridge on the conductive bases of conductors 622 and 624, the extensions and ridges extending upwards some desired distance, such as 1.4 mils for the 1.4-mil conductor bases shown. This creates conductor profiles containing two channels, which further increases the surface area of the conductors.

FIG. 6C illustrates that subassembly 600 is then cleaned to remove the masking pattern 632 and masking layer 630. Subassembly 600 can then be used in a circuit board assembled, e.g., using the steps shown in FIGS. 3J and 3K.

Figure 7A:
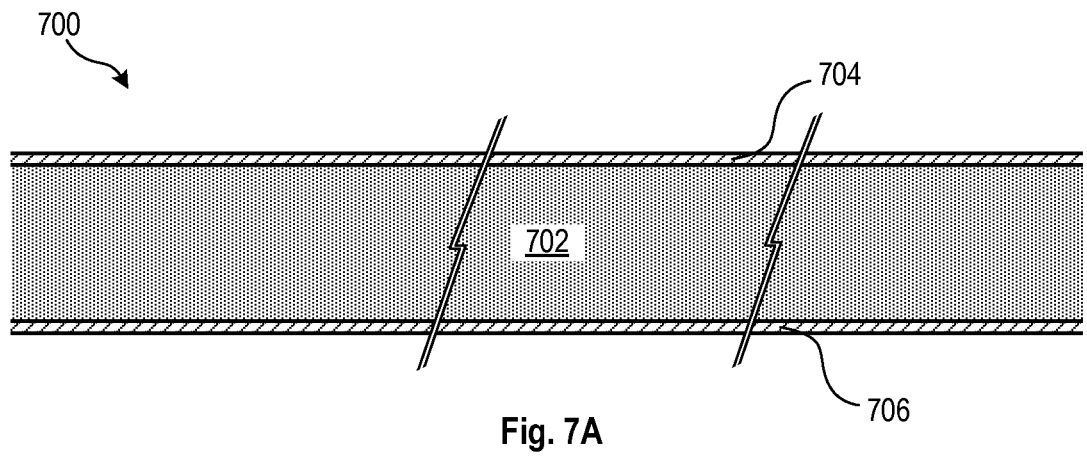
FIGS. 7A to 7I show steps in the fabrication of a circuit board containing a differential pair according to yet another embodiment.

FIGS. 7A-7I illustrate steps in constructing a circuit board according to another embodiment. FIG. 7A shows, in cross-section, a portion of one subassembly 700 of a circuit board. Subassembly 700 is similar to subassembly 300 in FIG. 3A, as it includes a dielectric core 702 with one conductive layer 704 bonded to its top and another conductive layer 706 bonded to its bottom. The primary difference between the two subassemblies is that conductive layers 704 and 706 have a very small nominal thickness, e.g., that needed for a plating seed layer.

Figure 7B:
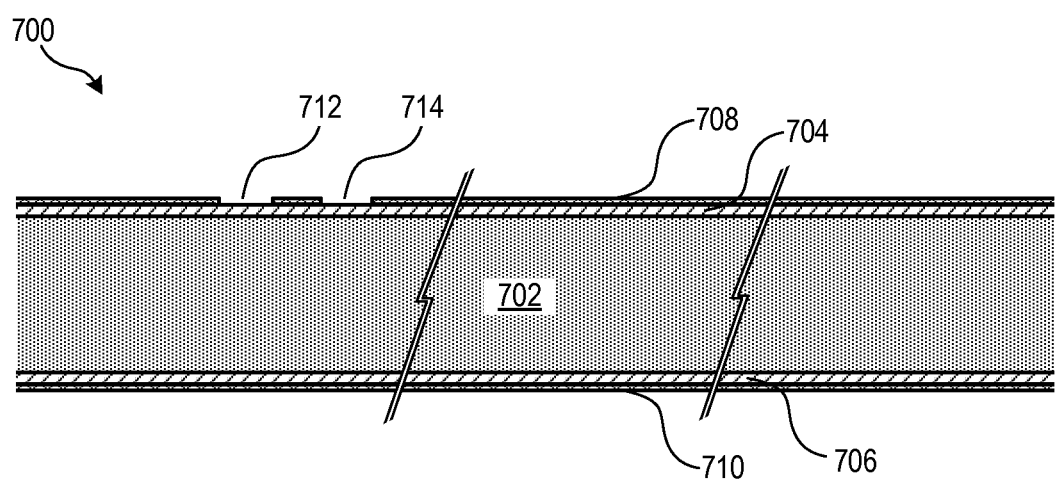

In FIG. 7B, a mask layer 710 covers conductive layer 706, and a mask layer 708 covers conductive layer 704. Mask layer 708 is created, e.g., by printing or photolithography, to contain gaps 712 and 714 that expose the upper surface of conductive layer 704. These gaps extend along the surface of dielectric core 702 to follow the desired position on the subassembly of the outer edges of a channeled conductor.

Figure 7C:
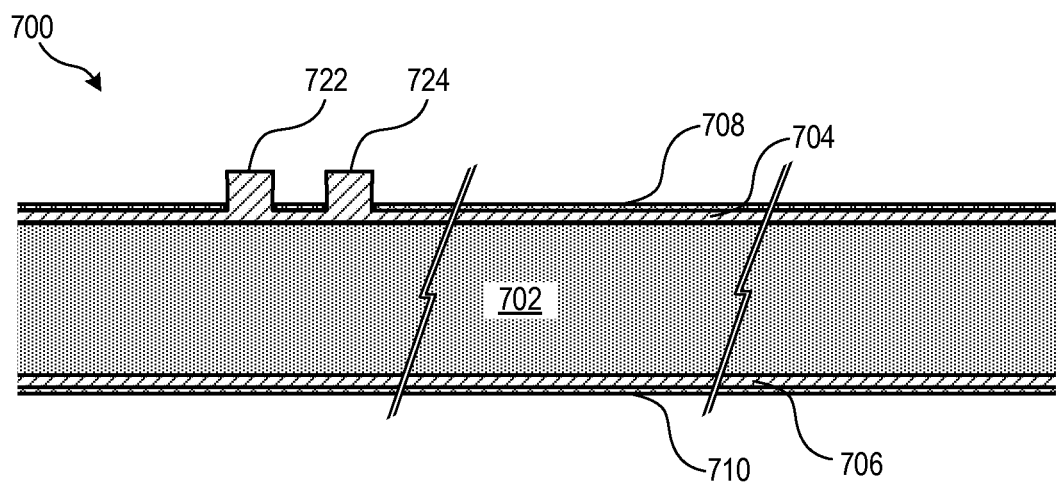
Figure 7D:
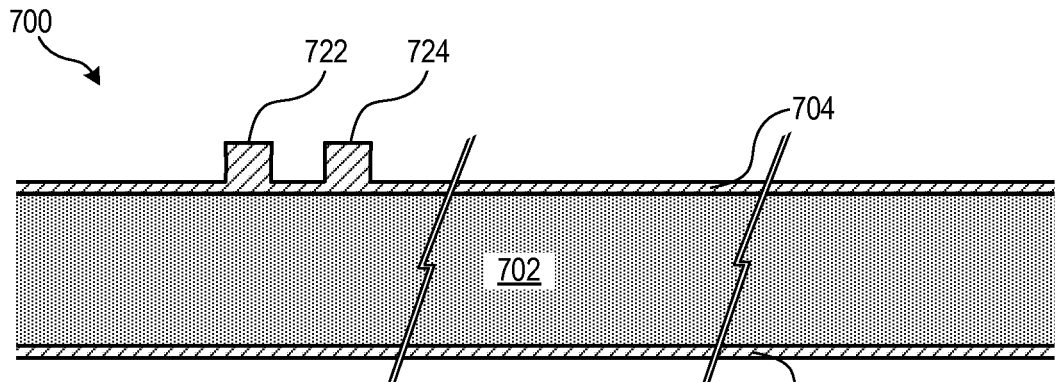

Subassembly 700 is subjected to a process, such as an electroplating process, that adds height to the exposed portion of conductive layer 704 in gaps 712, 714. As depicted in FIG. 7C, this plating process creates pillars 722 and 724 in gaps 712, 714, the pillars extending upwards some desired distance, such as 1.6 mils for an embodiment where the original thickness of conductive layer 704 is 0.2 mils. FIG. 7D illustrates that subassembly 700 is then cleaned to remove the masking layers 708, 710.

Figure 7E:
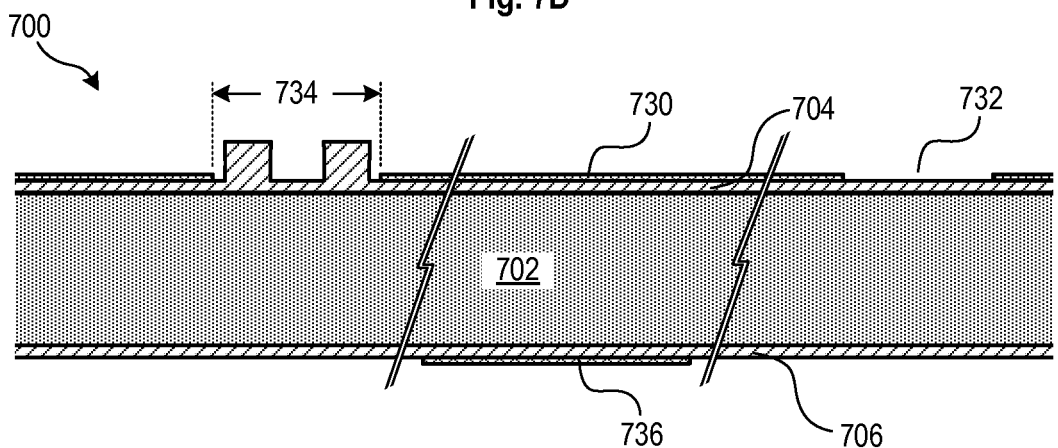

As shown in FIG. 7E, a new pattered mask layer is applied to both sides of the subassembly 700, forming a mask pattern 730 on conductive layer 704, and a mask pattern 736 on conductive layer 706. Mask pattern 730 contains a gap 734 that spans pillars 722 and 724 along their length, and another gap 732 where a rectangular-profile conductor is desired. Mask pattern 736 contains large openings where it is vertically aligned with gaps 732 and 734, but in another section—where no reference plane is desired—the mask pattern 736 remains intact.

Figure 7F:
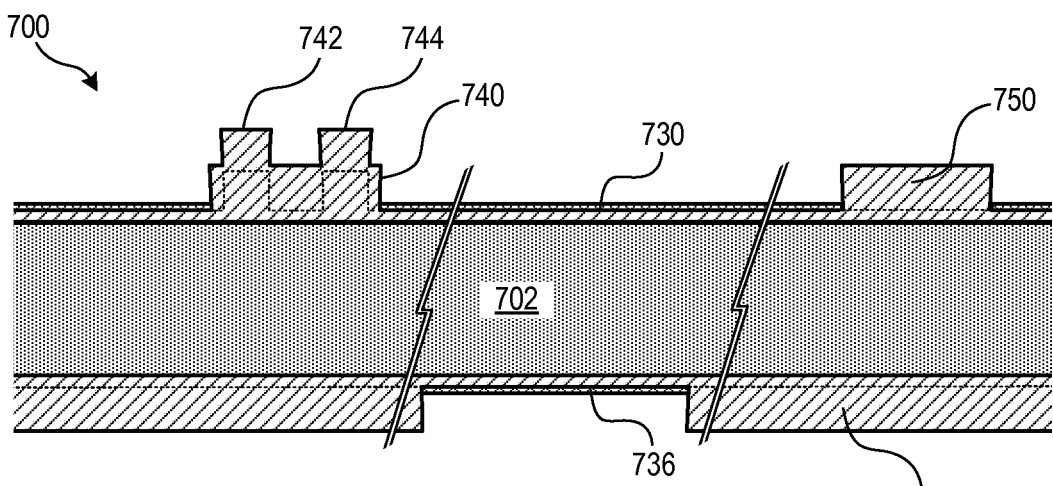
Figure 7G:
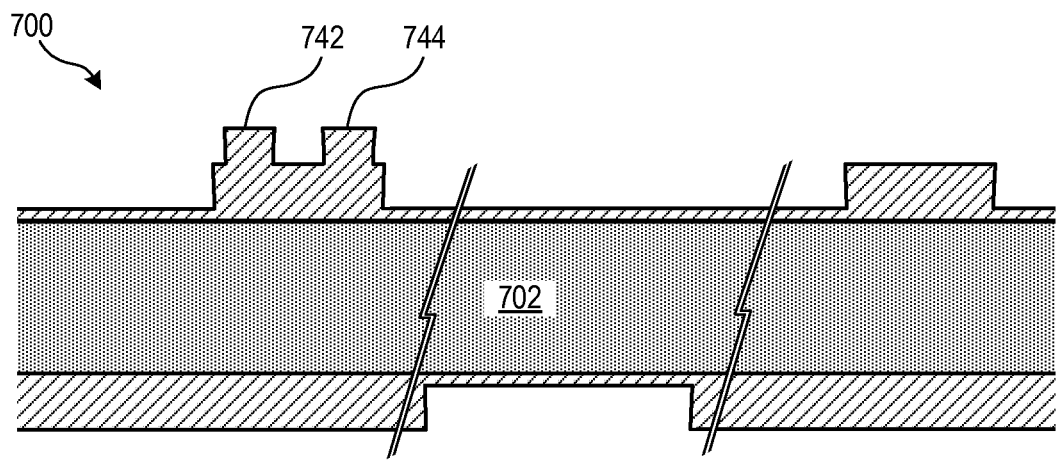

Subassembly 700 is once again subjected to a process, such as an electroplating process, that adds height to the exposed portion of conductive layer 704 in gaps 732 and 734, as well as adding height to the exposed portions of conductive layer 706. As depicted in FIG. 7F, this plating process creates rough conductors 740 and 750 and a rough reference plane layer 760. The plating process can be designed to add, e.g., 1.4 mils of thickness to conductive layers 704 and 706 in the exposed portions. As additional height is also added to pillars 722 and 724, rough conductor 740 will contain corresponding raised sections 742 and 744, with a lengthwise channel between them. FIG. 7G illustrates that subassembly 700 is then cleaned to remove the masking layers 730, 736.

Figure 7H:
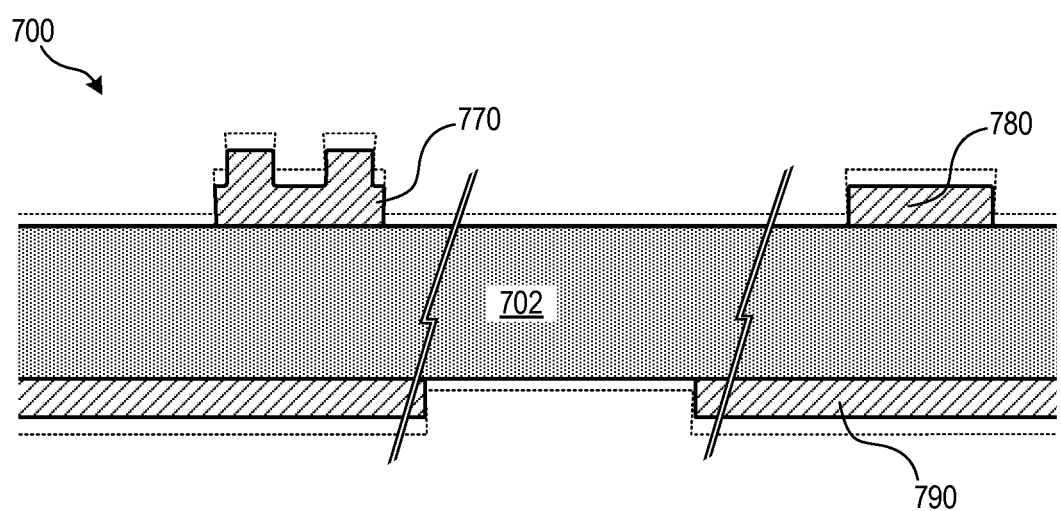
Figure 7I:
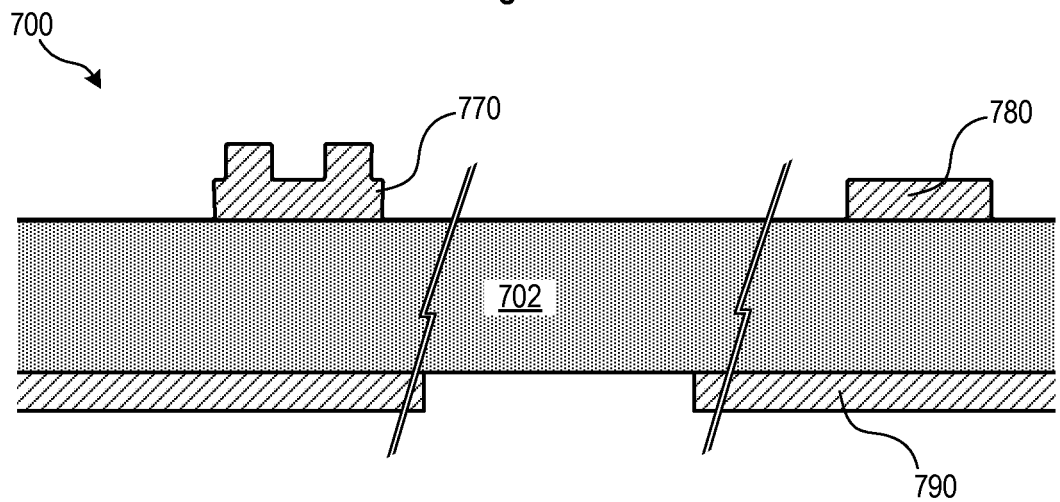

In FIG. 7H, a timed etch process is used to remove enough conductive material from the conductive layers 704 and 706 to clear the conductive material from sections of the dielectric 702 where conductive material was not added during plating. The timed etch also removes a portion of the height from the rough conductors and reference plane (see dotted lines for initial extent prior to etching). What remains, as shown in FIG. 7I, is a channeled conductor 770, a rectangular-profile conductor 780, and a patterned reference plane layer 790. Subassembly 700 can then be used in a circuit board assembled, e.g., using the steps shown in FIGS. 3J and 3K.

Figure 8A:
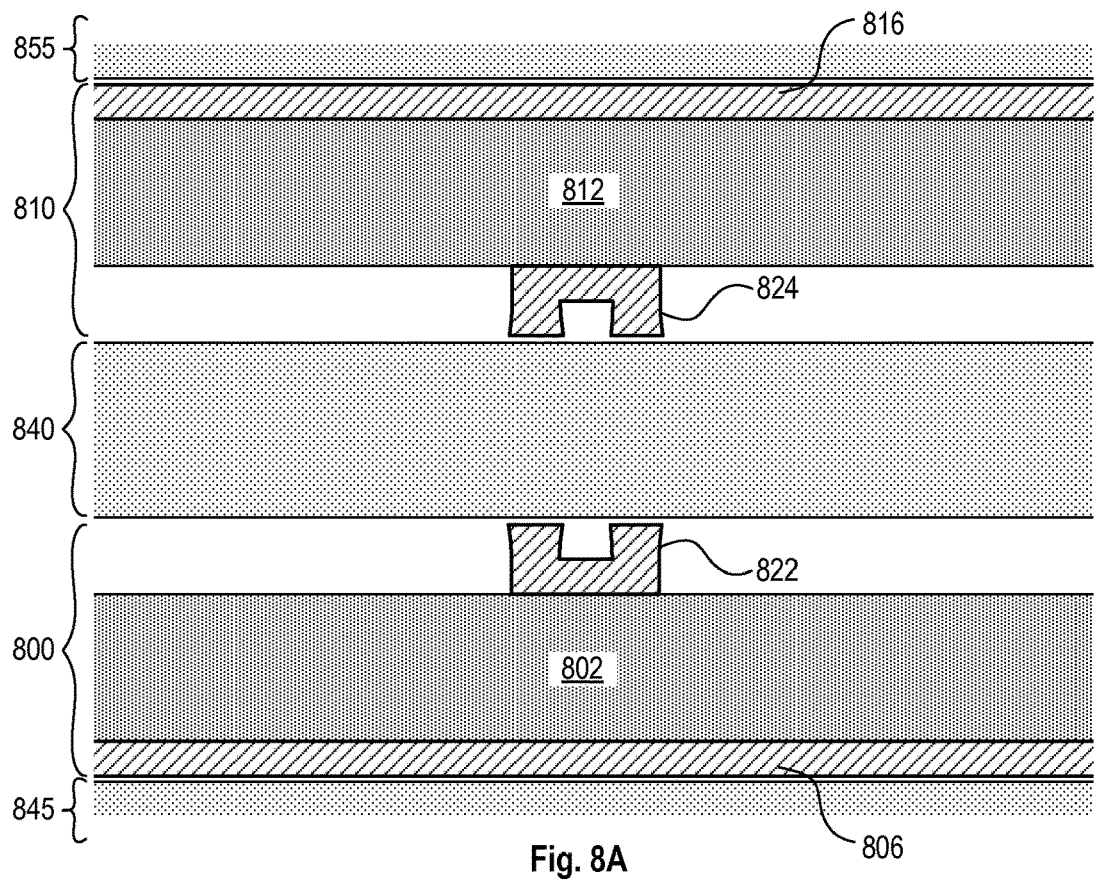
FIGS. 8A and 8B show steps in the fabrication of a circuit board containing a broadside-coupled differential pair according to an embodiment.
Figure 8B:
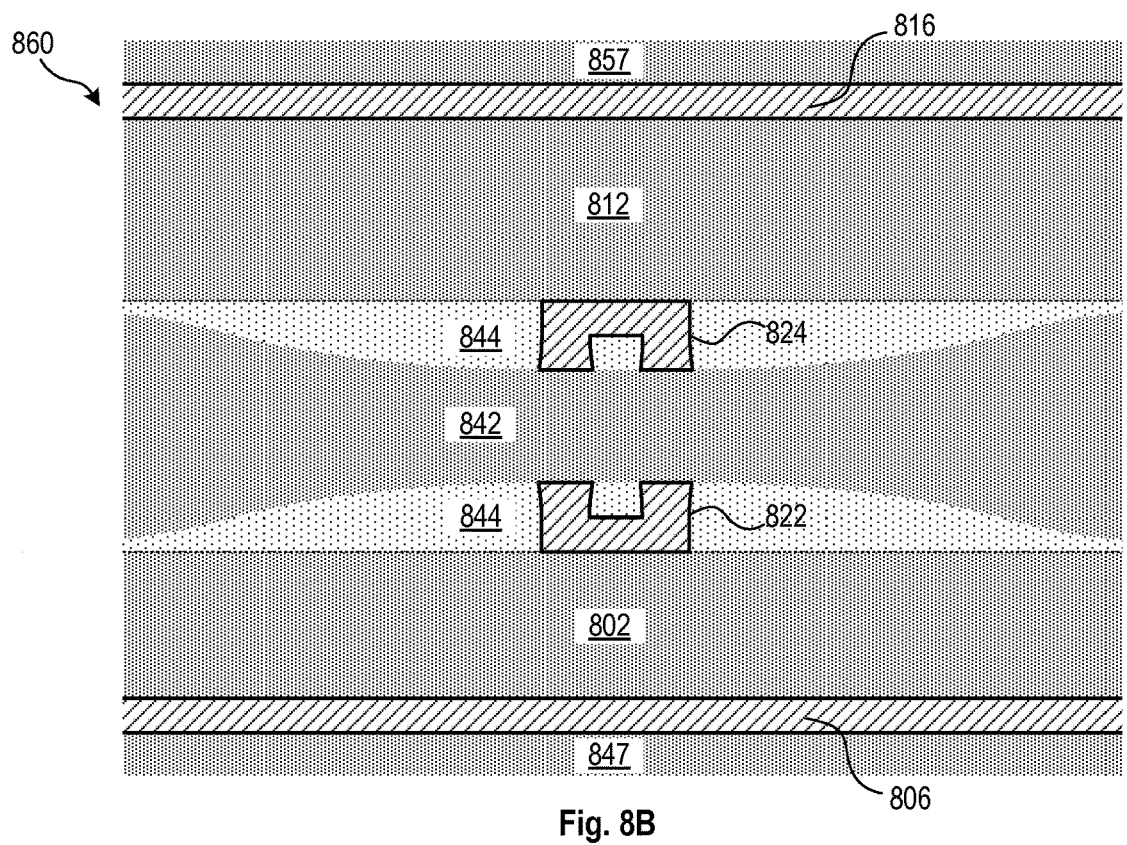

FIGS. 8A and 8B show a process for assembling a circuit board 860 from a variety of subassemblies and uncured dielectric layers. As compared to the aligned layers of FIG. 3J, the aligned layers of FIG. 8A contain a subassembly 800 similar to subassembly 300, uncured dielectric layers 840, 845, 855 similar to uncured dielectric layers 340, 345, and a subassembly 810 similar to subassembly 350 (partially illustrated in FIG. 3J). Subassembly 810 is flipped, however, such that a reference plane layer 816 overlies a dielectric core 812, which overlies a conductive trace layer containing a channeled trace 824. Subassembly 800 contains a conductive trace layer containing a channeled trace 822, overlying a dielectric core 802, overlying a reference plane layer 806. The alignment of the subassemblies places channeled trace 824 directly above channeled trace 822 (separated by the dielectric material) along the majority of the traces' lengths. Uncured dielectric layer 840 may contain more sheets of uncured material and/or a higher resin content than in FIG. 3J, as during curing layer 840 will be used to fill voids in two conductive trace layers.

FIG. 8B shows the final assembly of the subassemblies and layers into a cured circuit board 860. Uncured dielectric layers 845 and 855 are transformed into cured dielectric layers 847 and 857, which fill any gaps (not shown) in reference plane layers 806 and 816, respectively, and can bond the assembly to other circuit board layers above and below those shown. Uncured dielectric layer 840 is transformed into a cured dielectric layer including a lower-resin-content region 842 and a resin-rich region 844 surrounding conductive traces 822 and 824. In particular, the lengthwise channels in conductive traces 822 and 824 contain substantially only cured resin, while the region 842 contains far less cured resin, resulting in a difference in dielectric constant as described in the previous embodiment. Conductive traces 822, 824 form a broadside-coupled differential pair in circuit board 860.

Figure 9:
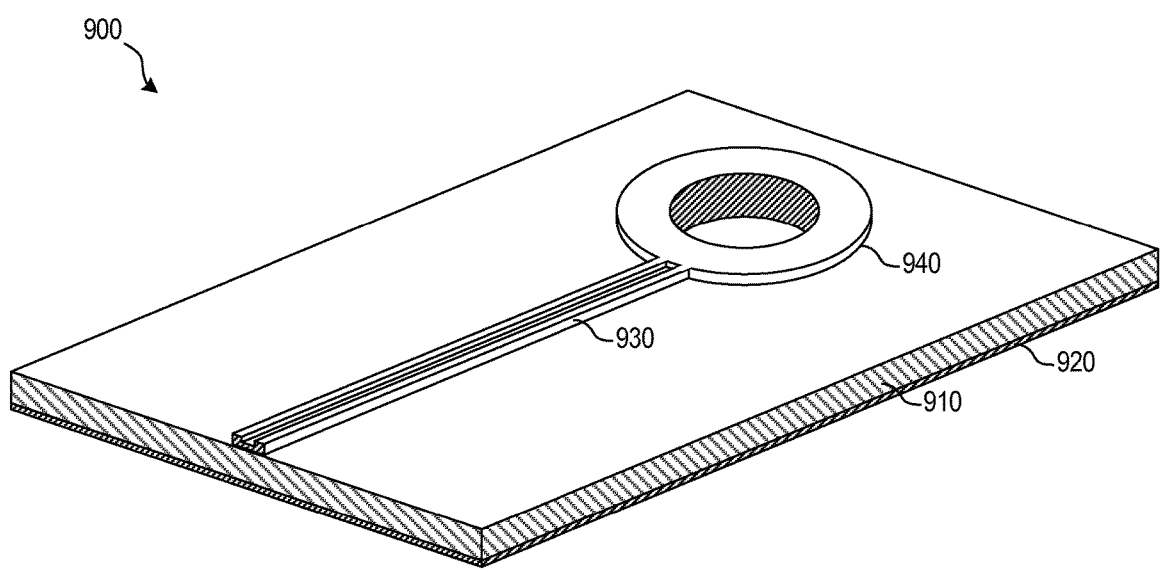
FIG. 9 shows detail of one embodiment for connecting a conductor according to an embodiment to a conductive pad used for connection to a PTH.

FIG. 9 shows, in perspective, a portion of a subassembly 900 containing a channeled trace 930 on a dielectric core 910 with an underlying reference plane layer 920. The channeled trace 930 ends at a pad 940. Pad 940 is subjected to the same process (e.g., additional plating and/or protection during etching) that forms the raised sides of conductor 930. Thus the top of pad 940 is substantially even with the top of trace 930. Pad 940 is also shown drilled, and plated through dielectric core 920, as it will exist in the final assembly, although portions of the plated barrel above and below the layers shown has not been illustrated so that features of the layer are visible.

Figure 10:
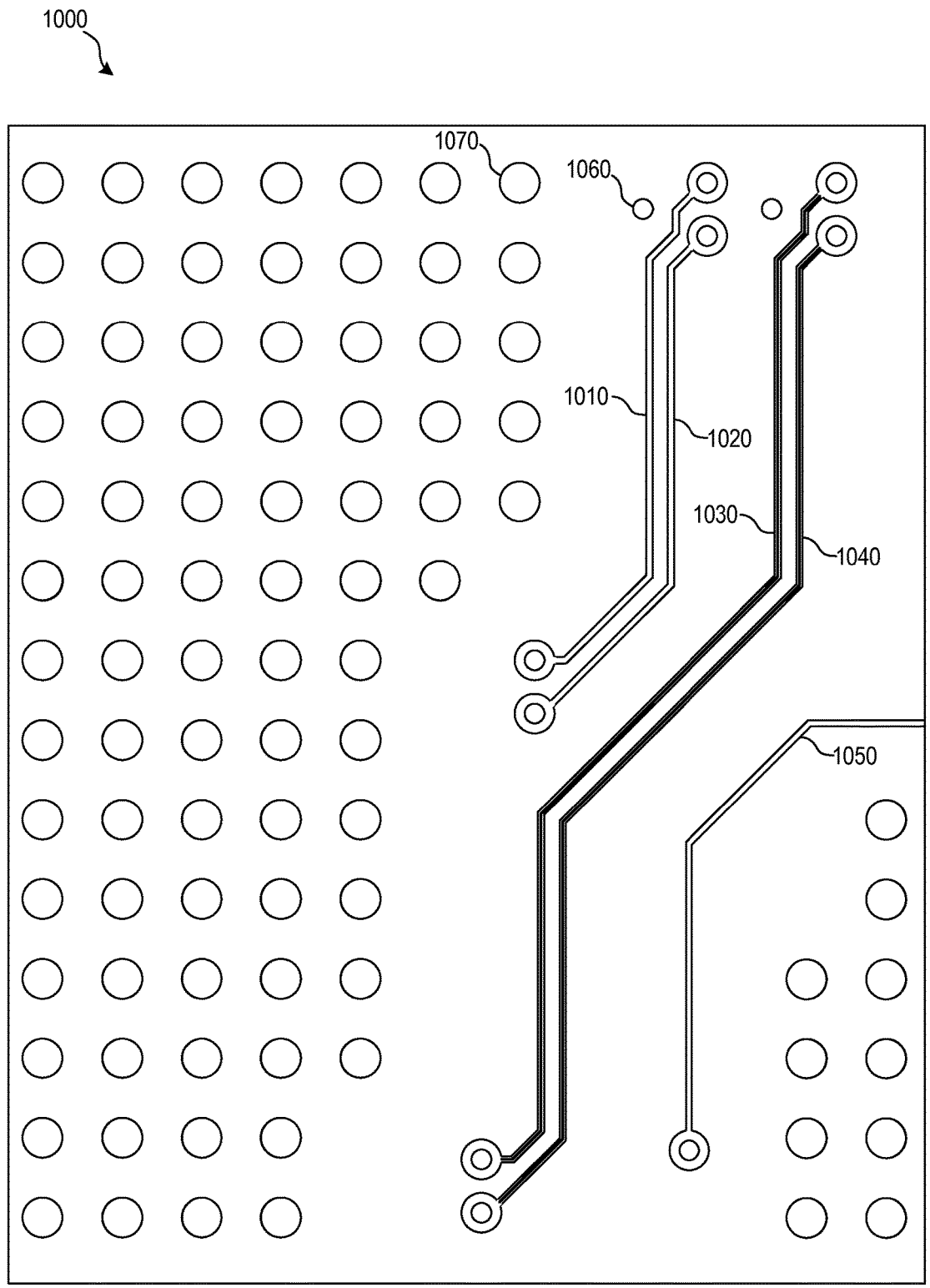
FIG. 10 shows a circuit board portion using traditional profile differential traces on shorter length differential trace pairs and differential traces with a profile according to an embodiment on longer differential trace pairs.

The high-frequency signal loss along a differential trace pair is generally proportional to the trace length. In at least some embodiments, a channeled conductor profile can be used on long differential trace pairs to reduce signal loss below a loss threshold that can be met for shorter differential trace pairs without a channeled conductor profile. Thus in some embodiments, such as the embodiment depicted in trace layer 1000 of FIG. 10, a mix of channeled conductors and rectangular-profile conductors can be used as needed. Trace layer 1000 shows a differential pair 1010, 1020, another differential pair 1030, 1040, a single-ended conductor 1050, ground through-holes (e.g., 1060), and thieving (e.g., 1070). The differential pair 1010, 1020 is short enough to not require channeled conductors for reliable high-speed signal transmission, and therefore uses rectangular profile conductors. The differential pair 1030, 1040 is longer, and uses channeled conductors to achieve reliable high-speed signal transmission. Single-ended conductor 1050 operates at lower speeds, and therefore can also use a rectangular profile conductor.

As discussed in the embodiments above, the designer can select the heights of conductors 1010, 1020, and 1050, and the height of thieving 1070, to match the height of conductors 1030 and 1040 (and their pads), or the height of channel portions of conductors 1030 and 1040, as desired. The designer can also determine a minimum conductor length that should use a channeled conductor, e.g., based on the trace/layer dimensions and materials and transmission rate desired for a differential pair. A channeled conductor can also be used for a single-ended trace, if so desired.

The increase in perimeter ratio for a channeled conductor provides some indication of the improvement is resistivity of the conductor at high frequency, although other effects (such as the waveguide effect described above) may also affect the performance of a channeled conductor. The graphs of FIGS. 11 and 12 compare channeled and rectangular conductors with given constraints.

FIG. 11 compares conductors of similar height and width, expressed as an aspect ratio (width/height). Plot line 1110 shows the ratio of the perimeter of a channeled conductor to the perimeter of a rectangular conductor of the same overall aspect ratio, where the channeled conductor has a single channel with a depth half the height of the conductor. At a typical aspect ratio of about 4:1, the channeled conductor has about 10% more perimeter, although it has 16.7% less volume.

Plot line 1120 shows a similar ratio, but for a channeled conductor with two channels with a depth half the height of the conductor. Even at an aspect ratio of 6:1, the channeled conductor has about 15% more perimeter, even though it has 30% less volume.

One may also compare the perimeter ratios of rectangular conductors to channeled conductors, where the two conductors have similar volume. In other words, consider a rectangular conductor of a given aspect ratio, and compare it to a channeled conductor where an equivalent amount of material removed from the rectangle to form a channel/channels is stacked alongside the channel/channels so that the two conductors have the same volume and the same width. In this case, FIG. 12, plot line 1210 shows that for a single channel with a depth half the height of the conductor, the channeled conductor has one-third more perimeter than a rectangular conductor with a 4:1 aspect ratio.

Plot line 1220 shows a similar ratio, but for a channeled conductor with two channels with a depth half the height of the conductor. Even at an aspect ratio of 6:1, the channeled conductor has almost 45% more perimeter.

Serializer/deserializer (serdes) designers typically design their differential transmitters and receivers to work at a given bit rate with a given channel model, which defines signal attenuation as a function of frequency. If a channel does not meet or better the channel model attenuation characteristics, there is no guarantee that a serdes pair will be able to reliably transmit data across the channel. As bit rates increase, the maximum channel length that can meet the channel model may shrink drastically.

IEEE standard 802.3ap defines one channel model for 10 Gbps (Gigabit per second), using the channel model equation for channel loss A in dB $$A=20\log(e)(b_1\mathrm{sqrt}(f)+b_2 f+b_3 f^2+b_4 f^3), \qquad (1)$$

where f is frequency in Hz and $b_1=2\times10^{-5}$ $b_2=1.1\times10^{-10}$ $b_3=3.2\times10^{-20}$ $b_4=-1.2\times10^{-30}$.

Figure 13:
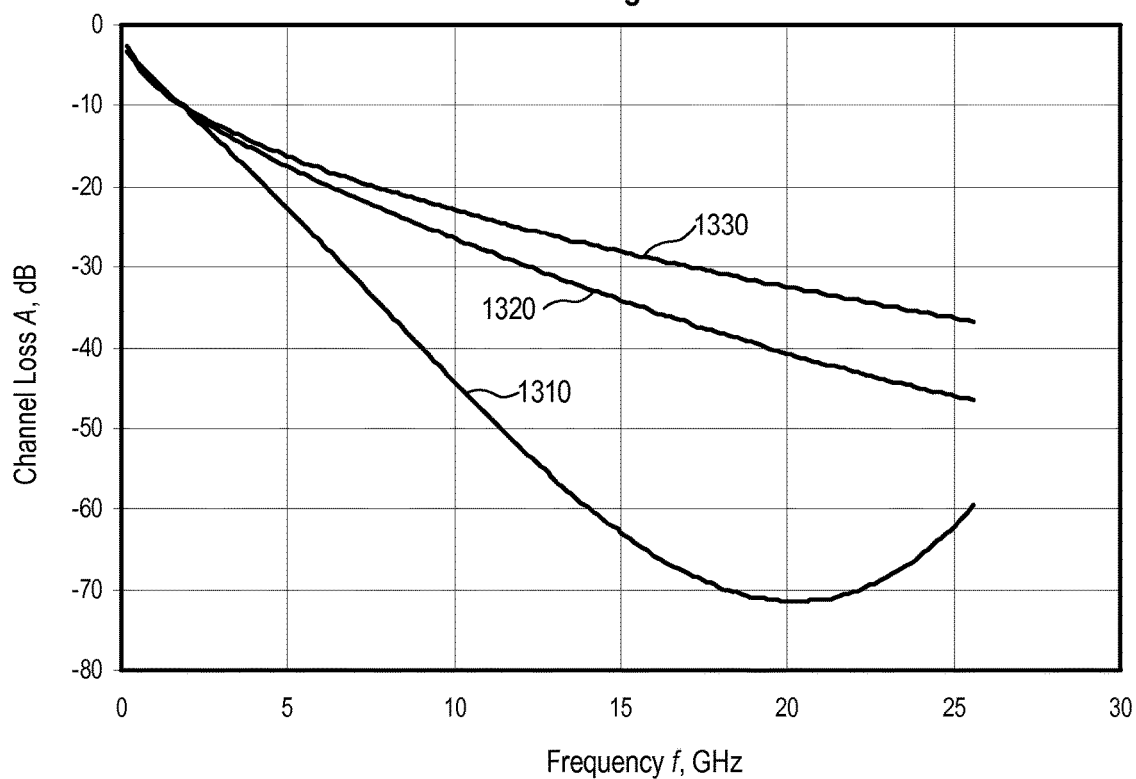
FIGS. 13-15 plot channel attenuation for several embodiments against channel models for 10 Gbps and 25 Gbps signaling.

This channel model is plotted in FIG. 13, line 1310. Although circuit board construction techniques and materials in use today allow rectangular-conductor differential pairs to meet this channel model over distances of 12 inches up to at least 24 inches, this channel model provides too much attenuation at frequencies over 10 GHz to be used with serdes operating at higher bit rates, such as a 25 Gbps serdes, over useful trace lengths.

A more useful channel model for 25 Gbps signaling would use the following channel loss coefficients in Equation 1 above:

$b_1=2.6\times10^{-5}$ $b_2=2.3\times10^{-11}$ $b_3=3.0\times10^{-21}$ $b_4=-8.1\times10^{-32}$.

This channel model is plotted in FIG. 13, line 1320.

Using the principles and materials described herein, a differential channel 30 inches long can be constructed that meets the line 1320 channel model. With serdes performance similar to that found in available 10 Gbps serdes, such a channel should be useful for transmitting data at a 25 Gbps serial rate. Line 1330 maps the calculated channel attenuation for one such 30-inch channel, built with single-notched 7-mil traces on 14-mil spacing. Line 1330 delivers better theoretical performance than the line 1320 channel model, with additional headroom available to compensate for real-world processing variability.

With shorter channel lengths, similar embodiments have been calculated to meet or exceed even more challenging signal models. For instance, FIG. 14 compares a 27-inch differential channel, built with single-notched 7-mil traces on 14-mil spacing (line 1430) to the 802.3ap channel model (line 1410) and a 25 Gbps channel model (line 1420) using the following Equation 1 coefficients:

$b_1 = 2.4 \times 10^{-5}$
$b_2 = 2.1 \times 10^{-11}$
$b_3 = 2.7 \times 10^{-21}$
$b_4 = -8.2 \times 10^{-32}$.

Figure 14:
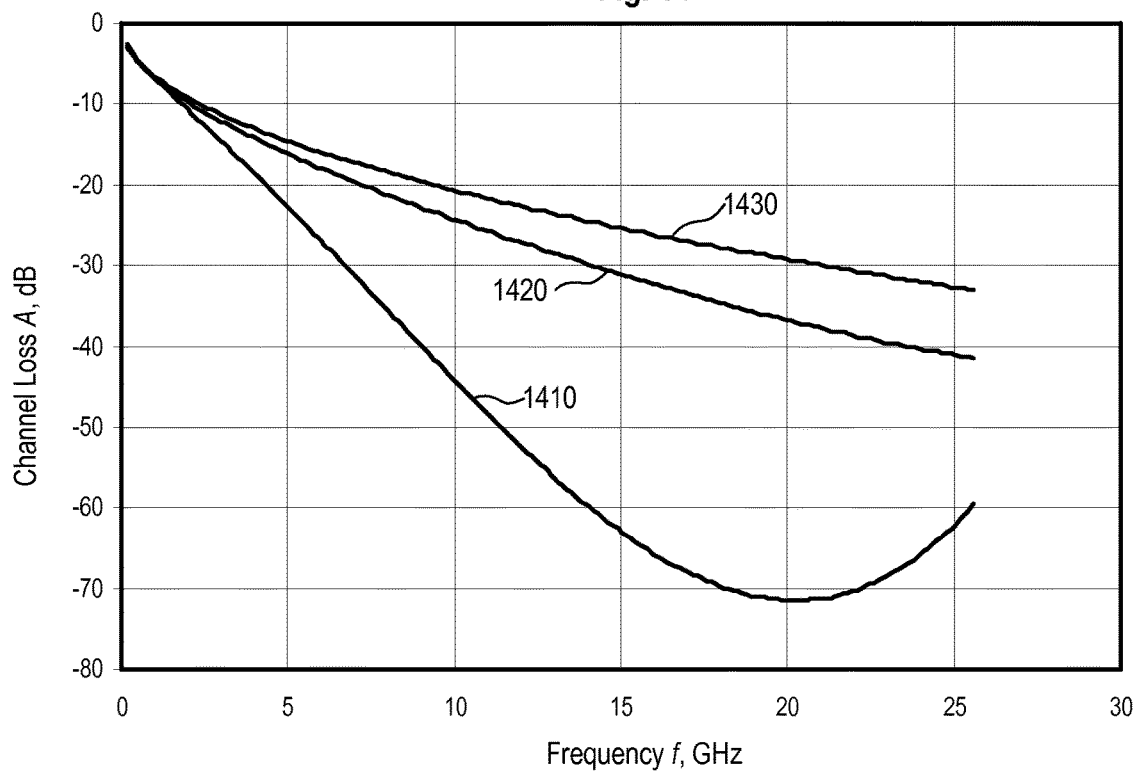
Figure 15:
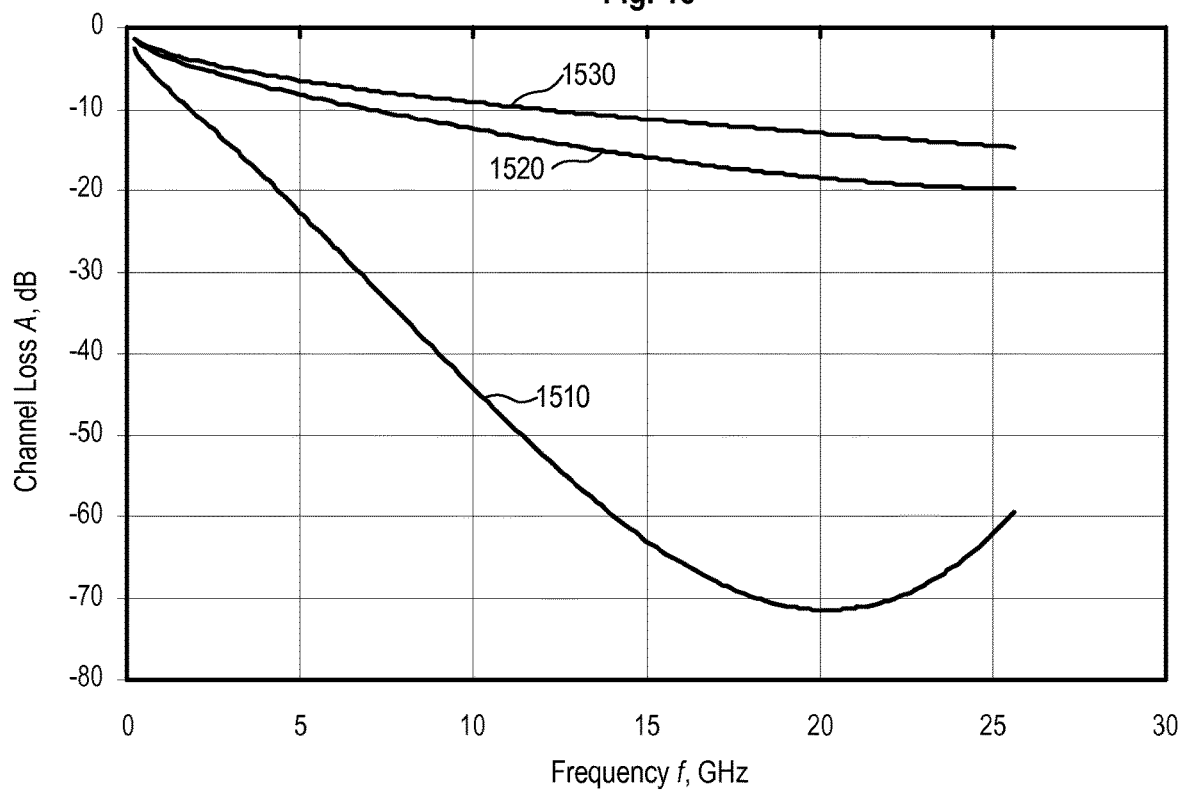

Another example, similar to FIG. 14 but for a 12-inch differential channel, is shown in FIG. 15 (line 1530). This channel is compared to the 802.3ap channel model (line 1510) and a 25 Gbps channel model (line 1520) using the following Equation 1 coefficients:

$b_1 = 1.2 \times 10^{-5}$
$b_2 = 1.2 \times 10^{-11}$
$b_3 = 1.9 \times^{-21}$
$b_4 = -7.1 \times 10^{-32}$.

None of the 25 Gbps channel models presented above are believed to be achievable at the present time with available construction materials and techniques and rectangular conductor cross-sections of the same lengths as those shown for notched conductors. It is apparent, however, that a wide variety of circuit boards can be adapted to transmit digital signals at bit rates greater than 10 Gigabits/second, which is extremely difficult to achieve with rectangular cross-section differential pairs for distances that would be found on a typical backplane.

In the previous embodiments, it was possible to create a resin-rich area in the channel(s) of a channelized conductor, and therefore create an area with a different dielectric constant in the channel, with the potential for beneficial waveguide effects. The following embodiments illustrate various ways in which this phenomenon can be expanded.

Figure 16:
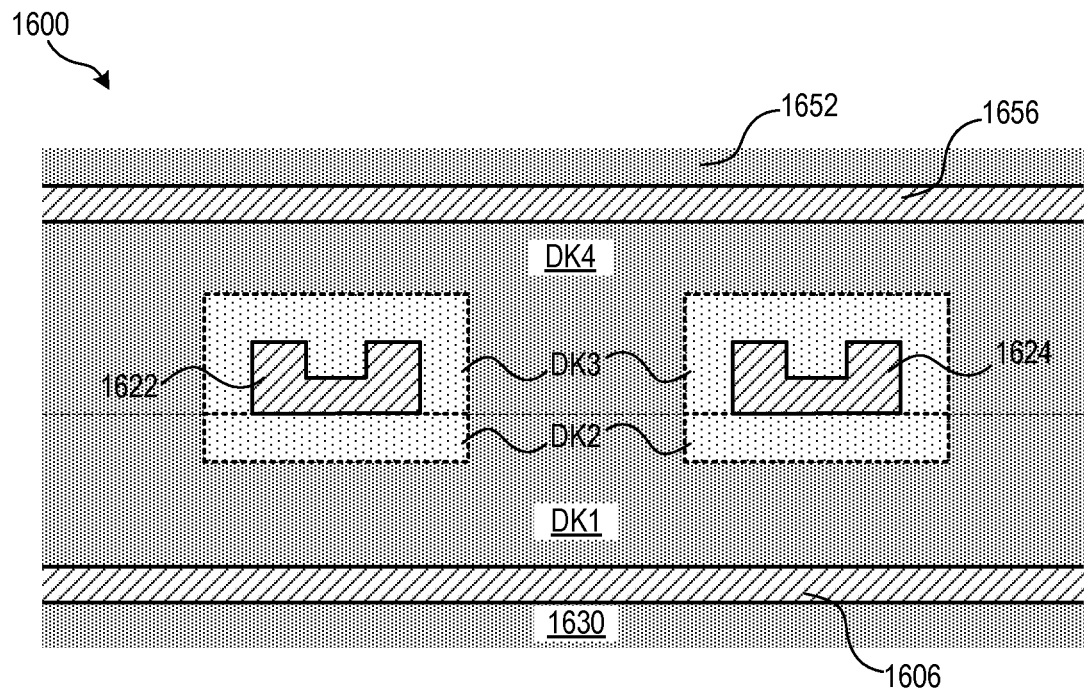
FIGS. 16-19 show, in cross-section, embodiments using multiple dielectrics in the region surrounding a differential trace pair.

FIG. 16 illustrates, in cross-section, an edge-coupled differential pair according to an embodiment 1600 that surrounds each conductor of the pair with a region of dielectric that differs from the primary board dielectric, at least in dielectric constant. A dielectric DK1 forms the core dielectric upon which the structure is built. Underlying the region where two differential conductors 1622, 1624 will be formed, however, DK1 is replaced with a different dielectric constant material DK2. A third dielectric material DK3, which may be the same material as DK2, overlies and surrounds the sides of conductors 1622 and 1624. Finally, a cured b-stage material DK4, which may be the same material as DK1, fills the remaining area between two reference planes 1606 and 1656. Other similar layers (partial layers 1630 and 1652) may exist adjacent to this high-speed layer.

In a preferred embodiment, DK2 and DK3 have a lower dielectric constant than DK1 and DK4. For instance, the dielectric constant of DK2 can be approximately equal to the dielectric constant of DK3 and in the range 2.0 to 3.6, preferably about 2.8. The dielectric constants of DK1 and DK3 can be approximately equal and in the range 3.9 to 4.1. It is now believed that the resulting dielectric constant discontinuity around each conductor can produce a waveguide effect at high frequencies, causing signal components to propagate along the lengthwise channels in the low-dielectric constant regions DK2, DK3. This can result in several primary benefits, including less phase separation of the different frequency components of a signal, increased angular velocity, reduced crosstalk to adjacent pairs, and less channel loss. Due to the reduction in crosstalk, it may be possible to move adjacent differential pairs or single-ended conductors closer to each other than would otherwise be possible or move two traces of a differential pair closer together while achieving the same differential coupling. Traces can also be widened to produce more skin area, as single-ended coupling to reference planes is reduced. The technique can also be selectively applied to some conductors and not others, e.g., to avoid extra complexity except where needed.

Figure 17:
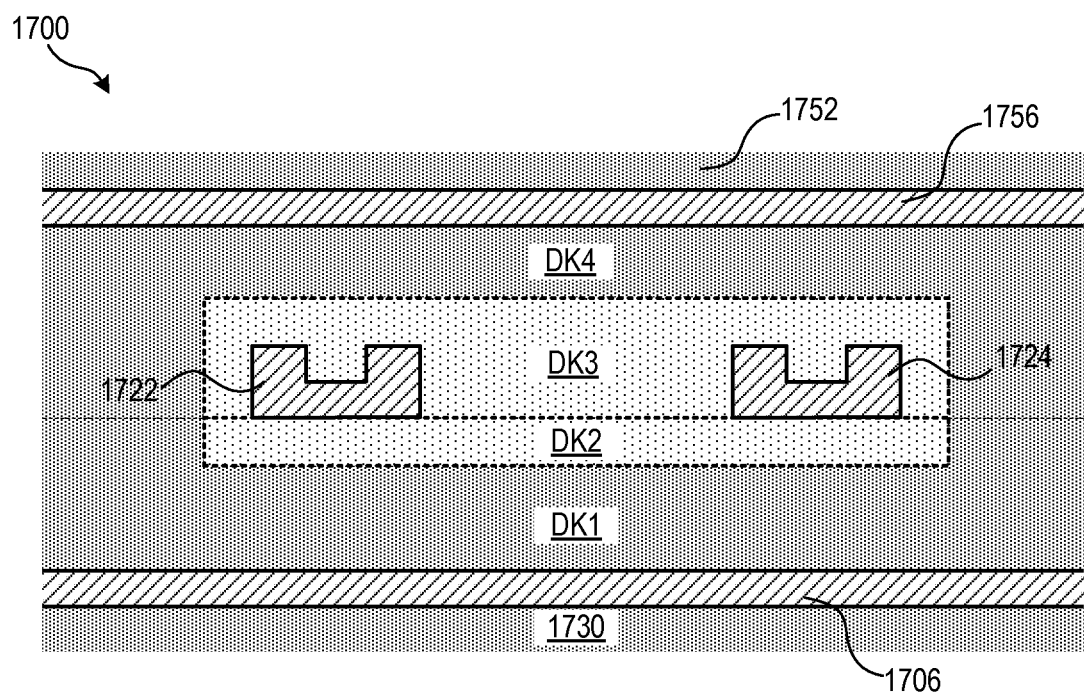

FIG. 17 illustrates, in cross-section, an edge-coupled differential pair according to an embodiment 1700 that surrounds the entire pair with a region of dielectric that differs from the primary board dielectric, at least in dielectric constant. This structure is similar to embodiment 1600, except DK2 and DK3 are extended to occupy the entire region between two differential conductors 1722, 1724. It is believed that this structure can be used to further tailor the differential/single-ended coupling characteristics of a differential pair 1722, 1724 to each other and to a pair of reference planes 1806, 1856. The structures shown in FIGS. 16 and 17 can be blended in a transition zone as well, where the space between two conductors that is not occupied by DK2 and DK3 in the FIG. 16 structure is gradually decreased until DK2 and DK3 merge into the FIG. 17 structure. Other similar layers (partial layers 1730 and 1752) may exist adjacent to this high-speed layer.

Figure 18:
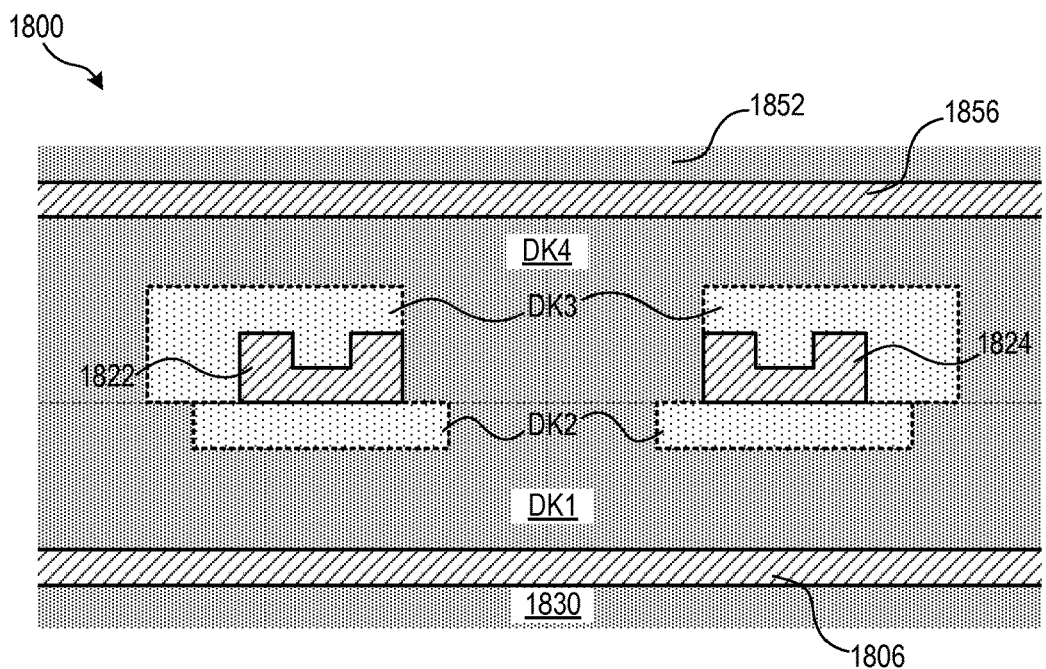

FIG. 18 illustrates, in cross-section, an edge-coupled differential pair according to an embodiment 1800 that surrounds three sides of each conductor of a differential pair with a region of dielectric that differs from the primary board dielectric, at least in dielectric constant. This structure is similar to embodiment 1600, except DK3 is shifted/decreased such that DK3 is adjacent the outboard sides of differential pair traces 1822, 1824 but not adjacent the inboard sides of the traces (DK4 fills this region instead).

Figure 22:
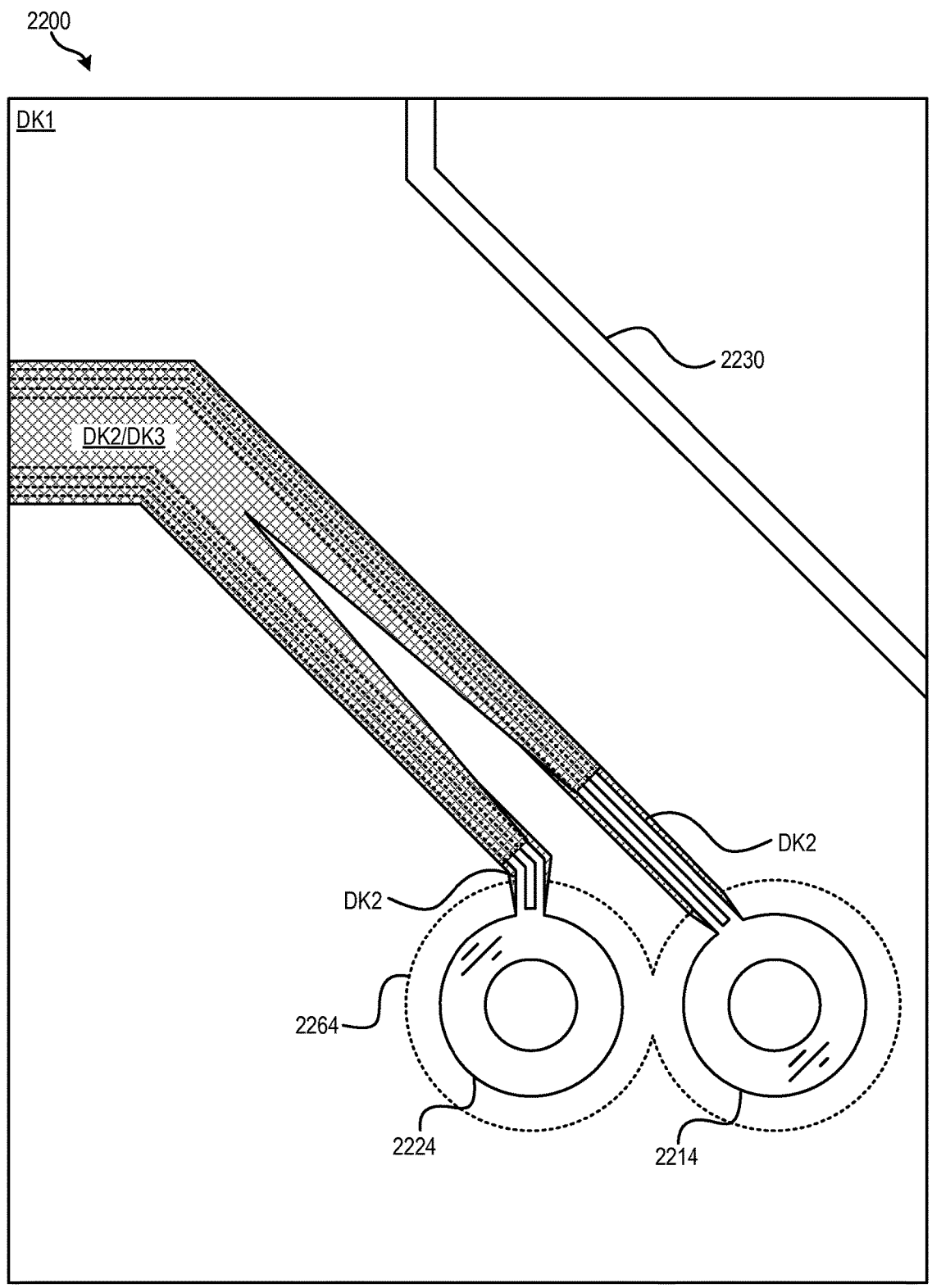
FIG. 22 shows a plan view of a multiple dielectric structure around a differential trace pair.

FIG. 22 shows, in plan view, a portion of a circuit board structure 2200. The portion shown includes a dielectric layer DK1 on which is formed the two traces of a differential pair 2214, 2224 and a single-ended trace 2230. A central portion of single-ended trace 2230 and a terminal portion (including through hole pads) of differential pair 2214, 2224 is shown. A second dielectric DK2 is placed under traces 2214, 2224 (excluding the pads). The terminal ends of DK2, under the pad/trace junction, taper out to the full width desired. Once the two traces begin running parallel, DK3 is included overlying the traces. DK3 begins in an alignment similar to that shown in FIG. 18, with DK3 tapering out gradually until eventually the entire region between 2214 and 2224 is filled with DK3 (similar to FIG. 17). Once DK3 has tapered out to the width of DK2, both DK2 and DK3 are tapered out together. Although traces 2214 and 2224 are shown parallel throughout the transition region, their spacing or shape may change as well in a given embodiment to prevent or reduce impedance discontinuities.

Figure 19:
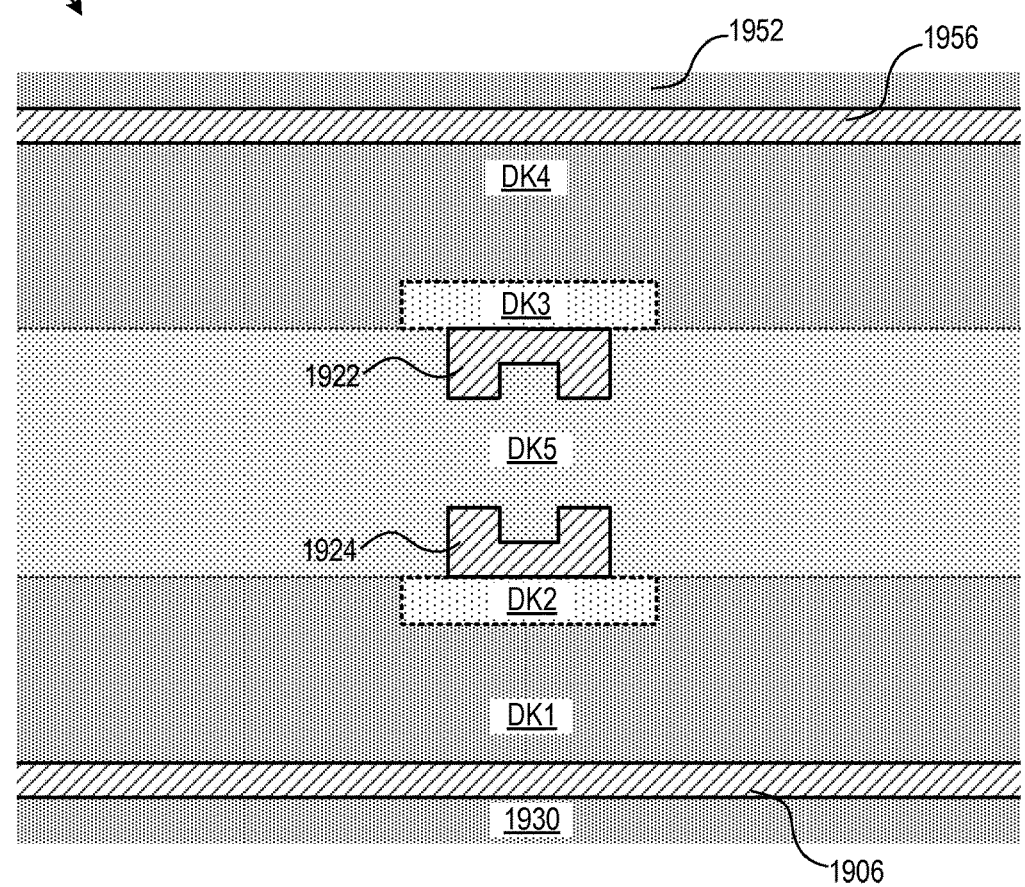

FIG. 19 shows, in cross section, a broadside-coupled differential trace pair 1922, 1924, on a portion of a circuit board 1900. Trace 1924 references to a reference plane 1906 through two dielectrics DK1 and DK2. DK1 is a core layer; DK2 is formed in a channel in DK1 underlying trace 1924. Likewise, trace 1922 references to a reference plane 1956 through two dielectrics DK3 and DK4, width DK4 being a core layer and DK3 formed in a channel in DK4 underlying trace 1922. The subassemblies (once comprising DK1, DK2, reference layer 1906, and trace 1924, the other comprising DK3, DK4, reference layer 1956, and trace 1922) are joined using a fifth dielectric DK5. Preferably, the dielectric constant of DK2 can be approximately equal to the dielectric constants of DK3 and DK5 and in the range 2.0 to 3.6, preferably about 2.8. The dielectric constants of DK1 and DK4 can be approximately equal and in the range 3.9 to 4.1.

FIGS. 20A-20H illustrate steps in the construction of a circuit board embodiment 2000 similar to, e.g., embodiment 1600 of FIG. 16. The same method, with mask modifications as needed, can be used to form the structures shown in FIGS. 17, 18, 19, and 22.

Figure 20A:
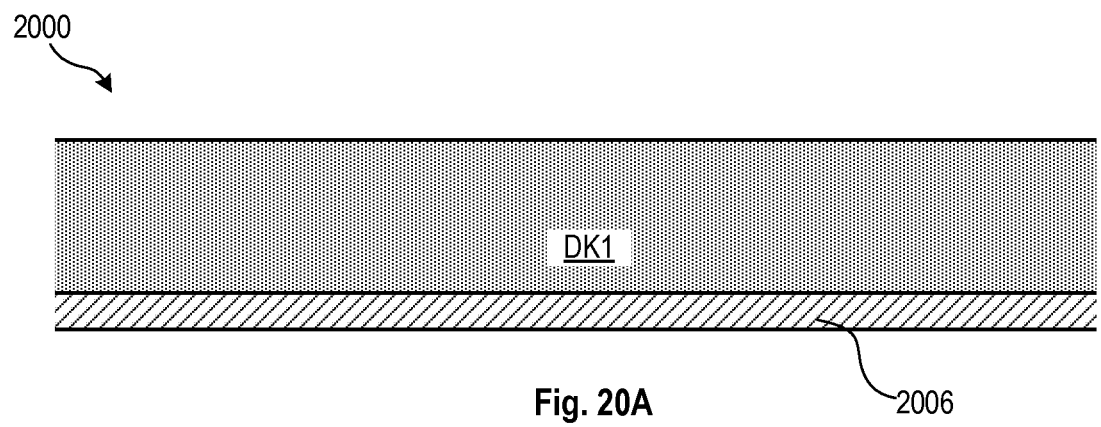
FIGS. 20A-20H show, in cross-section, an embodiment for constructing a circuit board using multiple dielectrics in the region surrounding a differential trace pair.

FIG. 20A shows the starting material for one signal/reference layer of the circuit board 2000. A core dielectric layer DK1 is plated on one side with, e.g., one-ounce copper, to form a conductive layer 2006. The other side of DK1 is left bare, or coated with a thin protective coating if needed.

Figure 20B:
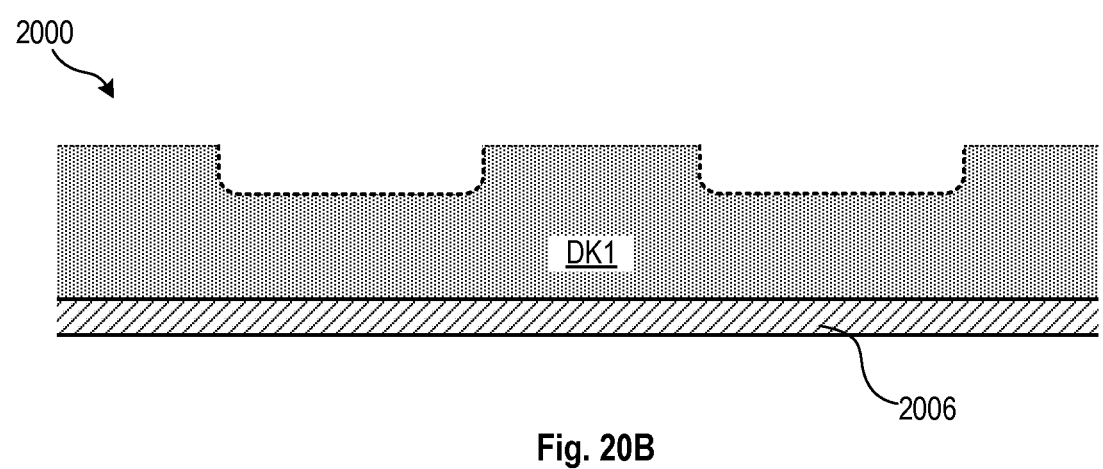

In FIG. 20B, DK1 is trenched in locations where DK2 is to exist. Laser ablation and masking/etching are both appropriate methods for creating the trenches.

Figure 20C:
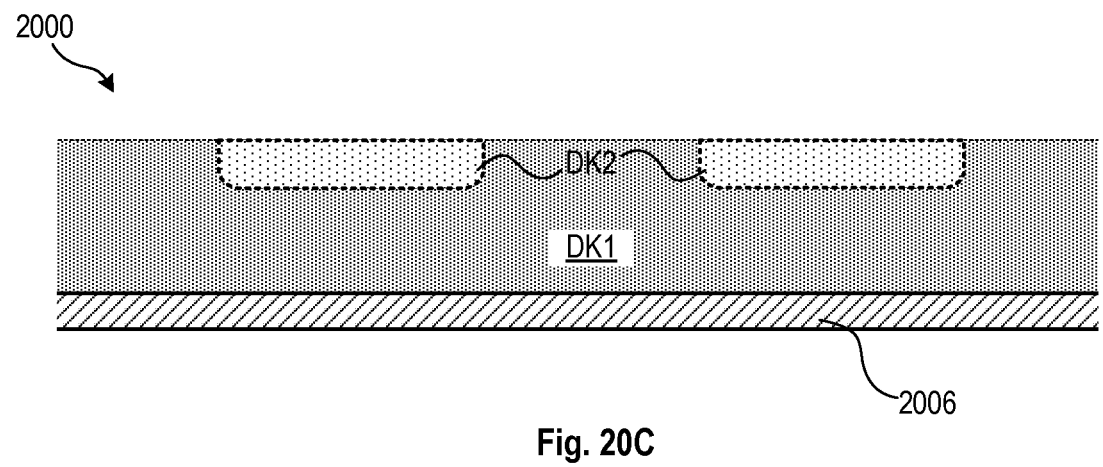

In FIG. 20C, the trenches created in FIG. 20B are filled with a dielectric DK2, e.g., a resin with a desired dielectric constant. The entire top surface of DK1 can be coated with a planar layer of DK2, cured, and etched back to remove most or all of DK2 except where DK2 fills the trenches.

Figure 20D:
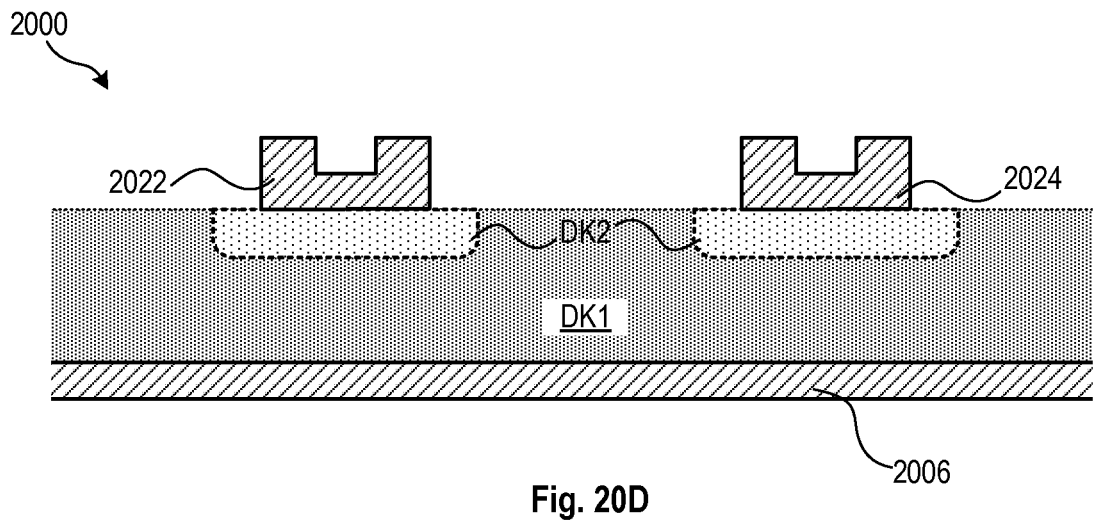

In FIG. 20D, conductors 2022 and 2024 are formed overlying the DK2 filled trenches. Any of the methods described herein for forming the channel structures can be used to form conductors 2022 and 2024. Alternately, the method of FIGS. 20A-20H can be combined with a traditional rectangular conductor.

Figure 20E:
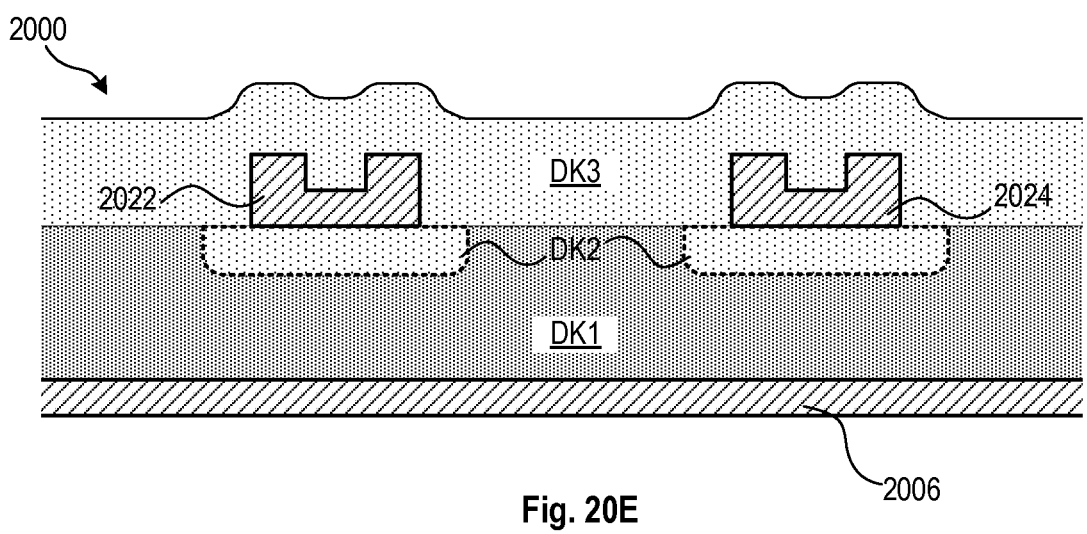

In FIG. 20E, a dielectric layer DK3, e.g., a resin, is deposited overlying the FIG. 20D structure, but is not completely cured at this time.

Figure 20F:
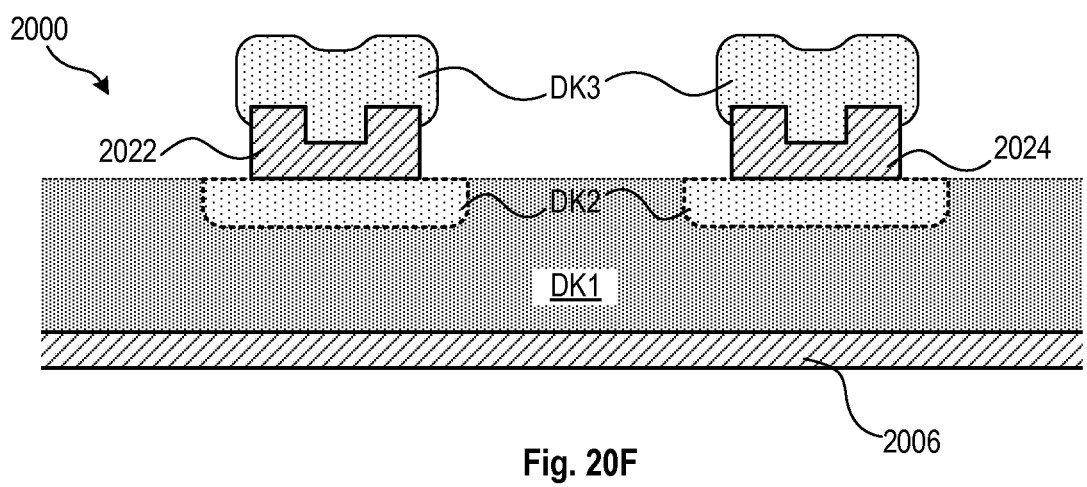

In FIG. 20F, a process (e.g., a mask/etch process) removes DK3, either completely or partially, everywhere except for on traces 2022 and 2024.

Figure 20G:
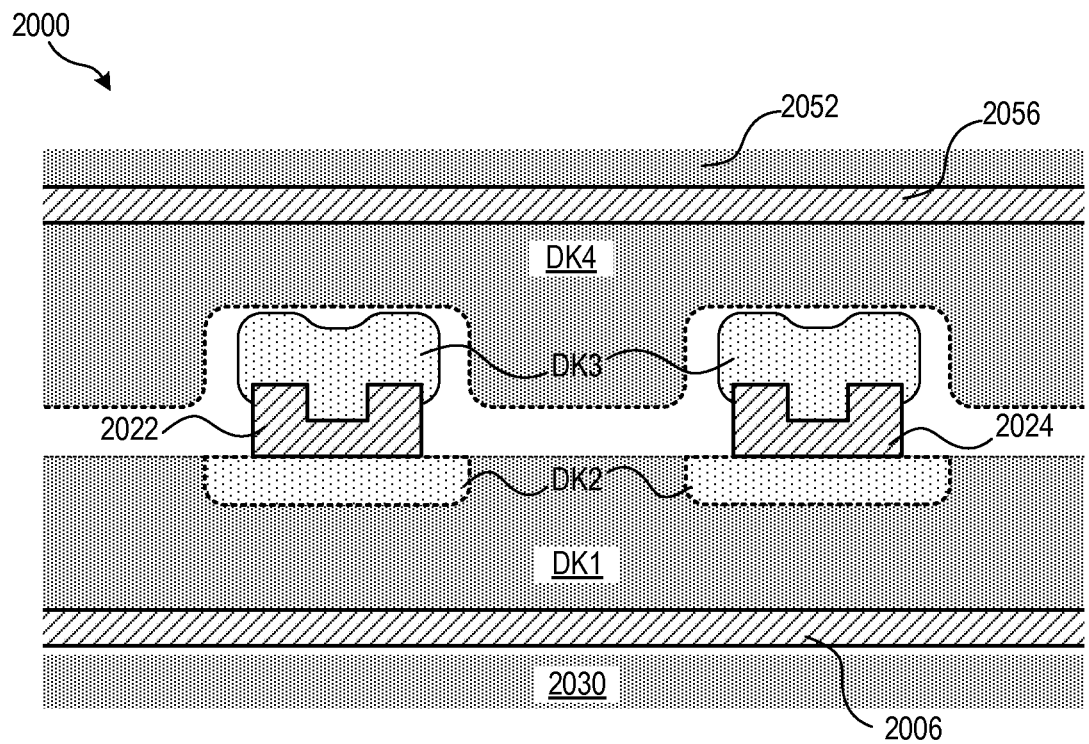

In FIG. 20G, an assembly containing a reference layer 2056 and dielectric DK4 is aligned over the FIG. 20F structure. Dielectric DK4 contains trenches registered with the locations of DK3.

Figure 20H:
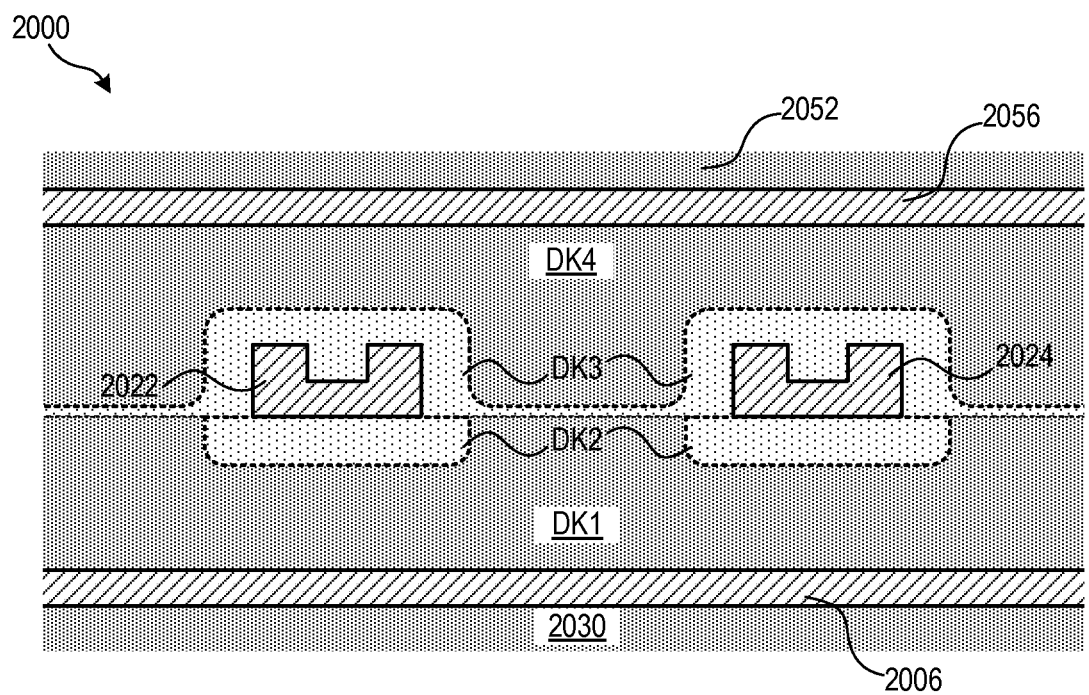

In FIG. 20H, assembly 2000 is bonded and cured under pressure, causing DK3, and DK4 if not completely cured, to flow and bond the structure together. In this process, dielectric layer DK1 is a core formed, e.g., using two sheets of Isola IS620 glass style 2113H with 52% resin content, and dielectric layer DK4 is formed using two sheets of an uncured resin-impregnated woven fiber dielectric material, such as Isola IS620 glass style 2113 with 58.2% resin content. DK2 and DK3 are formed with pure resin.

Figure 21A:
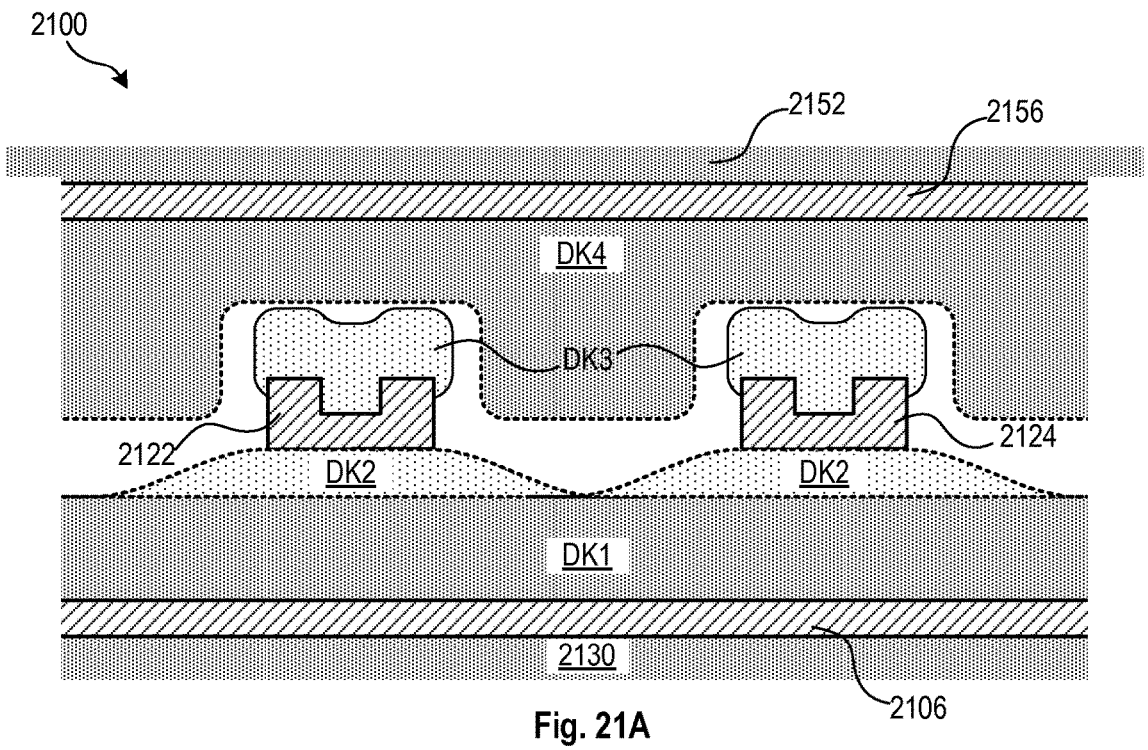
FIGS. 21A-21B show, in cross-section, another embodiment for constructing a circuit board using multiple dielectrics in the region surrounding a differential trace pair.
Figure 21B:
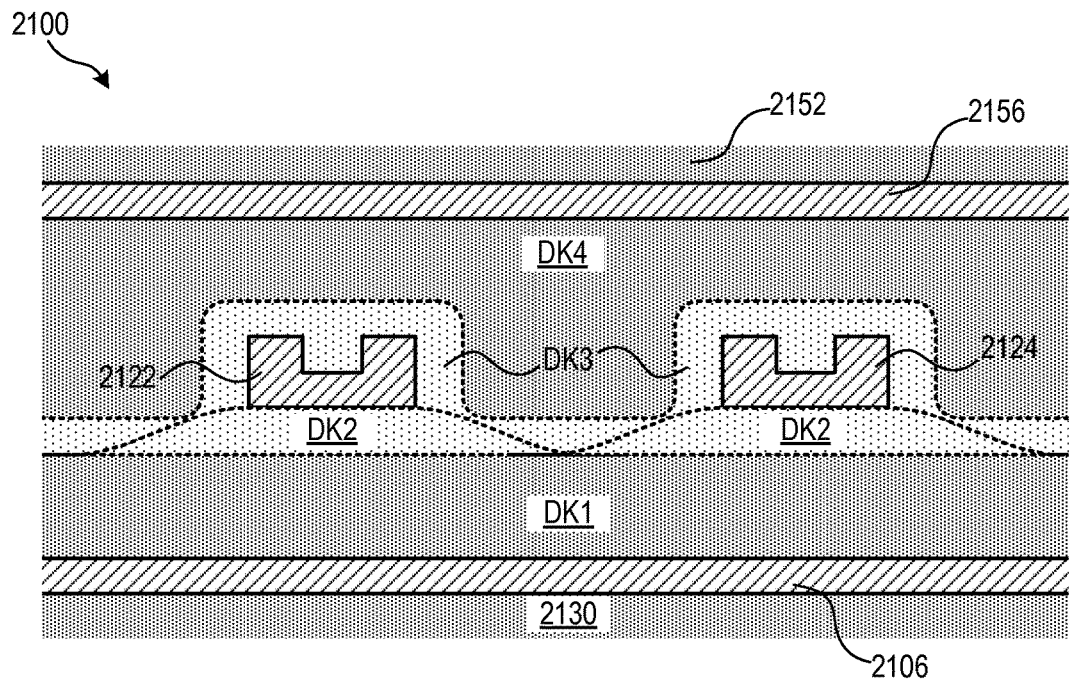

FIGS. 21A and 21B show, respectively, an intermediate step and final assembly according to another circuit board embodiment 2100. In the process of constructing circuit board 2100, the trench process is replaced with a built-up process that forms linear protrusions of DK2 material over a planar DK1 layer. A mask process and/or rough mask with fine control using laser ablation is used to form the DK2 protrusions from a solid layer. After the protrusions are formed, a process such as the one described for FIGS. 20D-20H is used to complete the structure.

Although a few embodiments have been described in detail, those skilled in the art will recognize many other ways in which the concepts described herein can be rearranged, combined, or used in part to construct other embodiments. The dielectric regions under and above a trace can be of various depths, up to and including replacing a local region of a dielectric layer all the way to the reference plane. Channeled profile conductors can be used on circuit boards that also mount active components, or circuit boards such as backplanes that contain passive transmission lines. Some trace layers of a circuit board can contain channeled profile conductors while others do not, which can reduce cost and fabrication complexity. As stated, channeled profile conductors can be mixed with rectangular profile conductors on the same trace layer. Although exemplary thicknesses, widths, materials, etc., have been described, the principles described herein can be adapted to other situations to improve signaling performance.

Although several methods for forming channeled profile conductors have been described, these are intended to be exemplary and not exhaustive. Other methods, such as laser ablation, can be used to form channels in conductors. Various techniques from the methods described can be mixed with each other or with alternate techniques to achieve similar results.

The illustrated embodiments use channels with relatively perpendicular sides and bottoms. Other embodiments can use other channel shapes, as desired in a given embodiment.

Although the specification may refer to "an", "one", "another", or "some" embodiment(s) in several locations, this does not necessarily mean that each such reference is to the same embodiment(s), or that the feature only applies to a single embodiment.

What is claimed is:

1. A circuit board, comprising:
a first board dielectric layer;
a second board dielectric layer that is located adjacent the first board dielectric layer;
a first local dielectric region that is located within the first board dielectric layer and adjacent the second board dielectric layer;
a second local dielectric region that is located within the second board dielectric layer and adjacent at least the first local dielectric region within the first board dielectric layer; and
a pair of differential conductors that are each located within at least one of the first board dielectric layer and the second board dielectric layer, within at least one of the first local dielectric region and the second local dielectric region, such that the pair of differential conductors are positioned immediately adjacent both the first local dielectric region and the second local dielectric region,
wherein the first local dielectric region and the second local dielectric region are configured with dielectric constants that are different than dielectric constants of the first board dielectric layer and the second board dielectric layer such that crosstalk between the pair of differential conductors and a third conductor located within at least one of the first board dielectric layer and the second board dielectric layer is reduced.

2. The circuit board of claim 1, wherein the second board dielectric layer is located between the pair of differential conductors.

3. The circuit board of claim 1, wherein the second local dielectric region extends between the pair of differential conductors.

4. The circuit board of claim 1, wherein the second local dielectric region includes a second local dielectric region first portion that is located between a first differential conductor of the pair of differential conductors and the second board dielectric layer, and a second local dielectric region second portion that is located between a second differential conductor of the pair of differential conductors and the second board dielectric layer; and wherein a first differential conductor of the pair of different conductors includes a first differential conductor side, the second differential conductor of the pair of differential conductors includes a second differential conductor side that faces the first differential conductor side, the first local dielectric region that is located between each of the pair of differential conductors and the first board dielectric layer extends beyond each of the first differential conductor side and the second differential conductor side, and the second local dielectric region first portion is coplanar with the first differential conductor side and the second local dielectric region second portion is coplanar with the second differential conductor side.

5. The circuit board of claim 1, wherein each of the pair of differential conductors defines a channel that is located adjacent the second local dielectric region.

6. The circuit board of claim 1, wherein the dielectric constant of the first local dielectric region is equal to the dielectric constant of the second local dielectric region.

7. The circuit board of claim 1, wherein the dielectric constant of each of the first local dielectric region and the second local dielectric region is in the range of 2.0 to 3.6, and wherein the dielectric constant of each of the first board dielectric layer and the second board dielectric layer is in the range of 3.9 to 4.1.

8. The circuit board of claim 1, wherein the dielectric constant of each of the first local dielectric region and the second local dielectric region are different, and the dielectric constant of each of the first board dielectric layer and the second board dielectric layer are different.

9. A circuit board, comprising:
a first conductor and a second conductor that are configured to operate as a differential conductor pair, wherein a channel is defined along the length of each of the first conductor and the second conductor; and
a first local dielectric region that is located adjacent a second local dielectric region, wherein the first conductor and the second conductor are located within at least one of the first local dielectric region and the second local dielectric region and immediately adjacent both the first local dielectric region and the second local dielectric region;
wherein the first local dielectric region and the second local dielectric region are configured with a dielectric constant that is different than dielectric constants of at least one board dielectric layer that is located immediately adjacent the first local dielectric region and the second local dielectric region such that crosstalk between the differential conductor pair and a third conductor that is not included in the differential conductor pair is reduced when the first conductor and a second conductor are operating as the differential conductor pair.

10. The circuit board of claim 9, wherein the at least one adjacent board dielectric layer is located between the first conductor and the second conductor.

11. The circuit board of claim 9, wherein the second local dielectric region extends between the first conductor and the second conductor.

12. The circuit board of claim 9, wherein the first conductor includes a first conductor side, the second conductor includes a second conductor side that faces the first conductor side, the first local dielectric region extends beyond the first conductor side and the second conductor side, and a first portion of the second local dielectric region is coplanar with the first conductor side, and a second portion of the second local dielectric region is coplanar with the second conductor side.

13. The circuit board of claim 9, wherein the dielectric constant of each at least one local dielectric region is the same.

14. The circuit board of claim 9, wherein the dielectric constant of each at least one local dielectric region is in the range of 2.0 to 3.6, and wherein the dielectric constant of each at least one adjacent board dielectric layer is in the range of 3.9 to 4.1.

15. The circuit board of claim 9, wherein the dielectric constant of each of the first local dielectric region and the second local dielectric region are different.

16. A method for fabricating a circuit board, comprising:
providing a first board dielectric layer;
forming a first local dielectric region and a second local dielectric region on the first board dielectric layer;
forming a first conductor on the first local dielectric region and a second conductor on the second local dielectric region to provide a pair of differential conductors;
forming a third local dielectric region on the first conductor and a fourth local dielectric region on the second conductor; and
providing a second board dielectric layer on the first board dielectric layer, the third local dielectric region, and the fourth local dielectric region;
wherein the first local dielectric region, the second local dielectric region, the third local dielectric region, and the fourth local dielectric region are configured with dielectric constants that are different than dielectric constants of the first board dielectric layer and the second board dielectric layer such that crosstalk in the pair of differential conductors is reduced.

17. The method of claim 16, wherein the second board dielectric layer is located between the first conductor and the second conductor.

18. The method of claim 16, wherein the third local dielectric region and the fourth local dielectric region extend between the first conductor and the second conductor.

19. The method of claim 16, wherein the first conductor includes a first conductor side, the second conductor includes a second conductor side that faces the first conductor side, the first local dielectric region extends beyond the first conductor side, the second local dielectric region extends beyond the second conductor side, the third local dielectric region is substantially coplanar with the first conductor side, and the fourth local dielectric region is substantially coplanar with the second conductor side.

20. The method of claim 16, wherein the first conductor defines a channel that is located adjacent the third local dielectric region and the second conductor defines a channel that is located adjacent the fourth local dielectric region.

21. The method of claim 16, wherein the dielectric constant of the first local dielectric region, the second dielectric region, the third dielectric region, and the fourth dielectric region are approximately equal.

22. The method of claim 16, wherein the dielectric constant of each of the first local dielectric region, the second local dielectric region, the third dielectric region, and the fourth dielectric is in the range of 2.0 to 3.6, and wherein the dielectric constant of each of the first board dielectric layer and the second board dielectric layer is in the range of 3.9 to 4.1.

* * * * *